(12) United States Patent
Thomsen et al.

(10) Patent No.: US 9,641,186 B2
(45) Date of Patent: *May 2, 2017

(54) APPARATUS FOR DIGITAL-TO-ANALOG CONVERSION WITH IMPROVED PERFORMANCE AND ASSOCIATED METHODS

(71) Applicant: Silicon Laboratories Inc., Austin, TX (US)

(72) Inventors: Axel Thomsen, Austin, TX (US); Alan L. Westwick, Austin, TX (US)

(73) Assignee: Silicon Laboratories Inc., Austin, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/732,700

(22) Filed: Jun. 6, 2015

(65) Prior Publication Data

US 2016/0359497 A1 Dec. 8, 2016

(51) Int. Cl.
| | |
|---|---|
| *H03M 1/66* | (2006.01) |
| *H03M 1/06* | (2006.01) |
| *H03K 5/003* | (2006.01) |
| *H03M 1/68* | (2006.01) |
| *H03M 1/00* | (2006.01) |
| *H03M 1/74* | (2006.01) |

(52) U.S. Cl.
CPC .......... *H03M 1/0607* (2013.01); *H03K 5/003* (2013.01); *H03M 1/002* (2013.01); *H03M 1/0609* (2013.01); *H03M 1/66* (2013.01); *H03M 1/664* (2013.01); *H03M 1/682* (2013.01); *H03M 1/00* (2013.01); *H03M 1/747* (2013.01)

(58) Field of Classification Search
CPC .... H03M 1/808; H03M 1/0863; H03M 1/765; H03M 1/0678; H03M 1/0643; H03M 1/747; H03M 1/682; H03M 1/1061; H03M 1/0609; H03M 1/664; H03M 1/002
USPC .................................................. 341/118–155
See application file for complete search history.

(56) References Cited

U.S. PATENT DOCUMENTS 5,396,245 A * 3/1995 Rempfer ............. H03F 3/45479
341/121
5,801,655 A * 9/1998 Imamura ............... H03M 1/687
341/136

(Continued)

OTHER PUBLICATIONS

U.S. Appl. No. 14/732,701, filed Jun. 6, 2015, Thomsen et al.

(Continued)

*Primary Examiner* — Lam T Mai
(74) *Attorney, Agent, or Firm* — Law Offices of Maximilian R. Peterson

(57) ABSTRACT

Apparatus and associated methods are disclosed for digital-to-analog conversion with improved performance. In one exemplary embodiment, an apparatus includes a DAC to convert a digital input signal to an analog output signal. The DAC includes a decoder to decode the digital input signal and to provide first and second sets of control signals. The DAC also includes a resistor DAC (RDAC) to provide first and second voltages in response to the first set of control signals. The DAC further includes an interpolator coupled to receive the first and second voltages and to provide a first analog signal in response to the second set of control signals.

20 Claims, 15 Drawing Sheets

(56) References Cited

U.S. PATENT DOCUMENTS

| | | | | |
|---|---|---|---|---|
| 5,831,566 | A | * | 11/1998 | Ginetti .................. H03M 1/765 341/144 |
| 5,969,657 | A | | 10/1999 | Dempsey |
| 6,052,076 | A | * | 4/2000 | Patton, III .............. H03M 1/68 341/144 |
| 6,154,121 | A | | 11/2000 | Cairns |
| 6,246,351 | B1 | | 6/2001 | Yilmaz |
| 6,707,404 | B1 | * | 3/2004 | Yilmaz .............. H03M 1/1061 341/120 |
| 6,937,178 | B1 | * | 8/2005 | Rempfer ............. H03M 1/0678 341/144 |
| 7,135,928 | B2 | | 11/2006 | Behzad |
| 7,414,561 | B1 | * | 8/2008 | Brubaker ............ H03M 1/0682 341/145 |
| 8,717,214 | B1 | | 5/2014 | Li |
| 2009/0167953 | A1 | * | 7/2009 | Van Der Grinten ............ G11B 20/10009 348/607 |
| 2011/0181361 | A1 | | 7/2011 | Nolan et al. |

OTHER PUBLICATIONS

U.S. Appl. No. 14/732,702, filed Jun. 6, 2015, Thomsen et al.
Office communication in U.S. Appl. No. 14/732,701, Apr. 12, 2016, 9 pgs.
Office communication in U.S. Appl. No. 14/732,702, Feb. 16, 2016, 7 pgs.

* cited by examiner

| Code | $V_{odd}$ | $V_{even}$ |
|---|---|---|
| 0000000 | $1/128 \cdot V_{ref}$ | $0/128 \cdot V_{ref}$ |
| 0000001 | $1/128 \cdot V_{ref}$ | $2/128 \cdot V_{ref}$ |
| 0000010 | $3/128 \cdot V_{ref}$ | $2/128 \cdot V_{ref}$ |
| 0000011 | $3/128 \cdot V_{ref}$ | $4/128 \cdot V_{ref}$ |
| 0000100 | $5/128 \cdot V_{ref}$ | $4/128 \cdot V_{ref}$ |
| 0000101 | $5/128 \cdot V_{ref}$ | $6/128 \cdot V_{ref}$ |
| ... | ... | ... |

Fig. 5

APPARATUS FOR DIGITAL-TO-ANALOG CONVERSION WITH IMPROVED PERFORMANCE AND ASSOCIATED METHODS

CROSS-REFERENCE TO RELATED APPLICATIONS

This application is related to, and incorporates by reference for all purposes the following patent applications:

U.S. patent application Ser. No. 14/732,701, titled "Apparatus for Gain Selection with Compensation for Parasitic Elements and Associated Methods," filed on Jun. 6, 2015"; and U.S. patent application Ser. No. 14/732,702, titled "Apparatus for Offset Trimming and Associated Methods," filed on Jun. 6, 2015".

TECHNICAL FIELD

The disclosure relates generally to electronic apparatus for processing signals and, more particularly, to apparatus for digital-to-analog conversion with improved performance, and associated methods.

BACKGROUND

Electronic signal-processing often entails processing both analog and digital signals, sometimes called mixed-signal processing. Some sensors or transducers as well as natural properties or attributes, such as temperature, pressure, and the like, either constitute analog quantities or, in the case of sensors, often produce analog signals. Also, some transducers accept as inputs analog signals.

Conversely, signal-processing circuits and building blocks increasingly use digital signals and digital techniques for reasons such as repeatability, stability, flexibility, and the like, as person of ordinary skill in the art understand. To interface the signal-processing circuits with analog circuits, signal conversion circuits are used.

One type of signal conversion circuit constitutes digital-to-analog converter (DAC). DACs are typically used to accept a digital signal as an input, and to provide an analog signal as an output. Thus, DACs can provide an interface between digital processing circuits and analog circuits, such as transducers or other circuits.

Several figures of merit are used to characterize or specify DACs. Such figures of merit include resolution (the number of bits of information in the input digital signal), noise level, monotonicity, differential nonlinearity (DNL), cost, die area, power consumption, gain and offset levels and stability, and the like.

The description in this section and any corresponding figure(s) are included as background information materials. The materials in this section should not be considered as an admission that such materials constitute prior art to the present patent application.

SUMMARY

Apparatus and associated methods are disclosed for digital-to-analog conversion with improved performance. In one exemplary embodiment, an apparatus includes a DAC to convert a digital input signal to an analog output signal. The DAC includes a decoder to decode the digital input signal and to provide first and second sets of control signals. The DAC also includes a resistor DAC (RDAC) to provide first and second voltages in response to the first set of control signals. The DAC further includes an interpolator coupled to receive the first and second voltages and to provide a first analog signal in response to the second set of control signals.

In another exemplary embodiment, an apparatus includes a DAC. The DAC includes a current-source network that has a plurality of current sources that provide a plurality of currents, and a first switch network to selectively provide the plurality of currents provided by the plurality of current sources to a first node or a second node. The DAC also includes a resistor network, which has a plurality of resistors, coupled to provide an output signal. The DAC further includes a second switch network coupled to the resistor network to selectively couple resistors in the plurality of resistors of the resistor network to the first and second nodes.

In another exemplary embodiment, a method of converting a digital signal to an analog signal includes decoding the digital signal to generate a first set of control signals and a second set of control signals, and providing, by using an RDAC, first and second voltages in response to the first set of control signals. The method further includes interpolating the first and second voltages to provide a first analog signal in response to the second set of control signals.

BRIEF DESCRIPTION OF THE DRAWINGS

The appended drawings illustrate only exemplary embodiments and therefore should not be considered as limiting the scope of the application or the claims. Persons of ordinary skill in the art appreciate that the disclosed concepts lend themselves to other equally effective embodiments. In the drawings, the same numeral designators used in more than one drawing denote the same, similar, or equivalent functionality, components, or blocks.

FIG. 5 illustrates values corresponding to operation of a DAC according to an exemplary embodiment.

DETAILED DESCRIPTION

Figure 1:
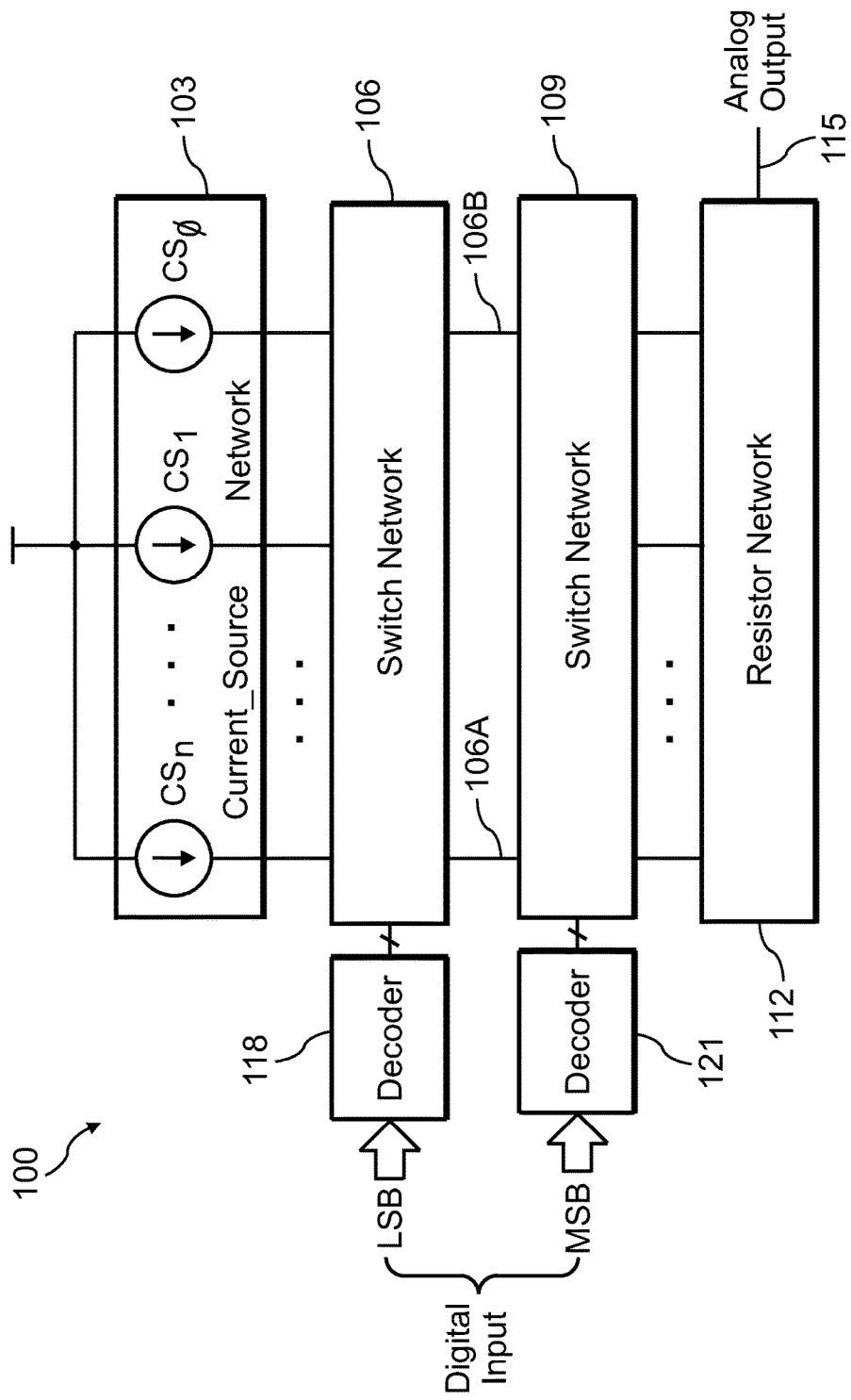
FIG. 1 illustrates a block diagram of a DAC architecture according to an exemplary embodiment.

One aspect of the disclosed concepts relates to DAC architectures and techniques that provide certain advantages and benefits. Examples of such benefits and advantages include improved performance and figures of merit, as described below in detail.

A variety of conventional DAC architectures exist. DACs that would meet relatively stringent specifications (e.g., monotonicity and relatively high resolution, for example, 12 bits) typically include a large number of devices, such as resistors, capacitors, and transistors (typically, metal oxide semiconductor field-effect transistors, or MOSFETs). A relatively simple conventional DAC uses $2^N$ elements for an N-bit resolution architecture, which typically take up relatively large die areas.

Also, some specifications of the DAC typically compete with its other specifications. For instance, monotonicity specifications often compete with high resolution. As another example, low-noise operation often competes with the overall power consumption by the DAC.

One technique for achieving monotonicity involves matching elements. In other words, various DAC devices or components or elements, such as resistors, capacitors, and MOSFETs, are matched to achieve monotonicity. Using component matching, current-mode DACs may thus be implemented that achieve monotonicity.

In such DACs, the elements are relatively large physically in order to achieve good matching, which is usually proportional to the square root of the element area. As the DAC resolution increases, the physical sizes of the elements also increases. Also, as the DAC resolution increases, the number of elements doubles for each additional bit of resolution. In a simple binary implementation, the total element area increases by a factor of 8 for each additional bit of resolution. More specifically, twice as many elements are used, and each element is four times larger.

In practice, although techniques may be used to reduce the area of the DAC circuitry, nevertheless the element area increases substantially as the resolution increases. One technique for reducing the amount of component matching entailed in improving DAC performance is to use thermometer decoding to select the higher-order bits (where matching considerations tend to dominate) and simple binary decoding on the lower-order bits. The die area for implementing thermometer decoding, however, is much larger than the area used to implement binary coding, which partially offsets the advantage of having a smaller overall element area.

Another type of conventional DAC does not depend on element matching, where each input code increment will add an element, so the output voltage or current will rise, regardless of the element's weighting. The DNL is determined by the absolute element variation, so that ±1 least-significant bit (or less-significant bit) (LSB) DNL is obtained if each element's value is within ±100% of the average. A brute force approach to achieving a monotonic DAC uses the same number of elements ($2^N$) as a simple non-monotonic DAC, but the decoding logic and the switches used in the DAC tend to be more complex. The reason is that all $2^N$ elements are controlled by unique digital signals, rather than the N signals used for a simple binary DAC.

DACs in various embodiments according to the disclosure reduce both the number of DAC elements and the complexity of the decoding circuitry. As a result, DACs according to various embodiments provide monotonic operation with relatively high resolution.

More specifically, DACs according to exemplary embodiments can provide 12 bits of resolution, relatively low-noise operation, and monotonicity (DNL of ±1 LSB), as well as relatively small die-size. (With static operation, the DAC output remains at the programmed voltage (i.e., the analog output voltage of the DAC that corresponds to the DAC's digital input) indefinitely without application of one or more clock signals.) Details of DAC architecture and operational techniques are described below in detail.

In some embodiments, DACs according to the disclosure use an architecture that includes a plurality of resistors, switches, and current sources. FIG. 1 illustrates a block diagram of the architecture of such a DAC. More specifically, FIG. 1 illustrates the architecture of DAC 100, which includes current-source network 103, switch network 106, switch network 109, and resistor network 112, which includes a plurality of resistors.

Current-source network 103 includes a plurality of current sources (n+1 sources in the example shown), labeled CS0-CSn, respectively. The output currents of current sources in current-source network 103 are provided to switch network 106. Switch network 106 causes the output currents of the current sources in current-source network 103 to be provided to node (or circuit leg or circuit branch or circuit path) 106A or node (or circuit leg or circuit branch or circuit path) 106B.

As shown in FIG. 1, less-significant bits (LSB) of the digital input signal to the DAC drive inputs of decoder 118. Decoder 118 decodes the LSB to generate control signals for switch network 106. In response to the control signals, switch network 106 can provide the output currents of current-source network 103 to either node 106A or to node 106B. Viewed differently, switch network 106 selectively steers the output currents of current-source network 103 to nodes 106A and 106B. Switch network 106 steers the output currents so as to maintain monotonicity of DAC 100.

Nodes 106A-106B are coupled to switch network 109. The more-significant bits (MSB) of the digital input signal to the DAC drive inputs of decoder 121. Decoder 121 decodes the MSB to generate control signals for switch network 109. In response to the control signals, switch network 109 couples nodes 106A and 106B to resistor network 112. Thus, depending on the control signals, the currents flowing through nodes 106A-106B flow through selected parts of resistor network 112. Switch network 109 couples nodes 106A-106B to resistor network 112 so as to maintain monotonicity of DAC 100. In response, resistor network 112 provides an analog output.

In exemplary embodiments, decoder 118 and decoder 121 may be implemented or realized in a variety of ways, and may use a variety of configurations or topologies. In some embodiments, decoder 118 may constitute a thermometer decoder, whereas decoder 121 constitutes a binary decoder.

Note that, to facilitate presentation, FIG. 1 omits certain blocks of DAC 100. For example, the analog output of resistor network 112 may be coupled to a buffer or amplifier (not shown) to provide the analog output signal of DAC 100, which may be used to drive an external load. As another example, biasing circuitry is not shown in FIG. 1.

Figure 2:
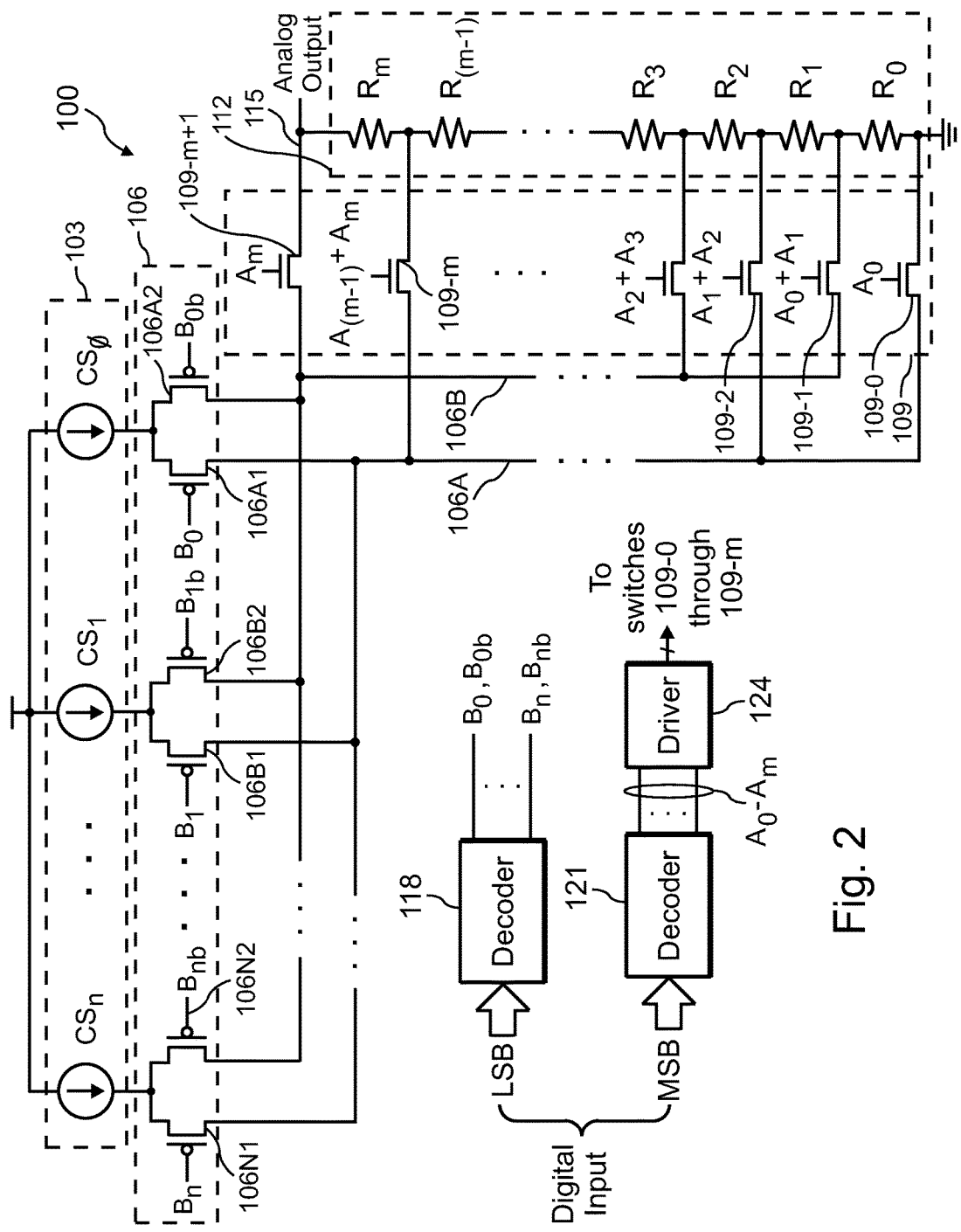
FIG. 2 depicts a circuit arrangement for a DAC according to an exemplary embodiment.

FIG. 2 depicts a circuit arrangement for a DAC 100 according to an exemplary embodiment. DAC 100 in FIG. 2 operates similarly to the DAC shown in FIG. 1. Referring to FIG. 2, DAC 100 includes current-source network 103, switch network 106, switch network 109, and resistor network 112.

Similar to FIG. 1, current-source network 103 in FIG. 2 includes a plurality of current sources (n+1 sources in the example shown), labeled CS0-CSn, respectively. The output currents of current sources in current-source network 103 are provided to switch network 106.

Switch network 106 includes a plurality of switches 106A1-106N2. In the example shown, switches 106A1-106N2 constitute p-channel MOSFETs. As person of ordinary skill in the art will understand, however, other types of switches may be used. The choice of switches depends on factors such as available technology, specifications for a given implementation, and the like, as person of ordinary skill in the art will understand.

Referring to switch network 106, switches 106A1-106N2 are arranged in pairs and coupled to a respective current source in current-source network 103. Thus, switch 106A1 and switch 106A2 are coupled to current source CS0. As another example, switch 106B1 and switch 106B2 are coupled to current source CS1, and so forth.

Switches 106A1-106N2 are controlled by signals labeled B0 through Bnb. Switches in a switch pair, described above, are controlled by complementary signals. For example, the control signal for switch 106A1, i.e., signal B0, is a logical complement of the control signal for switch 106A2, i.e., signal B0b. As another example, the control signal for switch 106B1, i.e., signal B1, is a logical complement of the control signal for switch 106B2, i.e., signal B1b, and so forth.

Switch network 106 causes the output currents of the current sources in current-source network 103 to be provided to node 106A or node 106B. The LSB of the digital input signal to the DAC drive inputs of decoder 118. Decoder 118 decodes the LSB to generate control signals for switches 106A1-106N2 in switch network 106, in response to which the respective output currents of the current sources are steered to one of two nodes.

More specifically, as shown in FIG. 2, the LSB of the digital input signal to the DAC drive inputs of decoder 118. Decoder 118 decodes the LSB to generate control signals for switch network 106, i.e., for switches 106A1-106N2. In response to the control signals, switch network 106 can provide the output currents of current-source network 103 to either node 106A or to node 106B.

More specifically, switch network 106 selectively steers the output currents of current-source network 103 to nodes 106A and 106B, maintaining monotonicity of DAC 100. For instance, consider the situation where signal B0 and signal B0b have logic values of low and high, respectively. As a result, switch 106A1 is turned on, and switch 106A2 is turned off. Switch 106A1 therefore conducts the output current of current source CS0 to node 106A.

Conversely, suppose that signal B0 and signal B0b have logic values of high and low, respectively. As a result, switch 106A1 is turned off, and switch 106A2 is turned on. Consequently, switch 106A2 conducts the output current of current source CS0 to node 106B.

Nodes 106A-106B are coupled to switch network 109. Switch network 109 includes a plurality of switches, labeled as 109-0 through 109-m in FIG. 2. The more-significant bits (MSB) of the digital input signal to the DAC cause switches 109-0 through 109-m to selectively conduct (depending on the MSB bits, as described below in detail), and thus couple nodes 106A-106B to resistor network 112.

The MSB bits drive the inputs of decoder 121. Decoder 121 decodes the MSB bits, and generates (m+1) output signals, labeled as A0-Am. Driver 124 generates switch-control signals for switches 109-0 through 109-m+1, i.e., it generates (m+2) switch-control signals.

More specifically, driver 124 derives the switch-control signals from the output signals of decoder 121, i.e., signals A0-Am. Signals A0 and Am control switches 109-0 and 109-m+1, respectively, without any further change. Switch 109-1 through 109-m, however, use switch-control signals that are derived according to logic operations performed on the outputs of decoder 121.

For example, the switch-control signal for switch 109-1 is (A0⊕A1), where the "⊕" symbol denotes a logical OR operation. As another example, the switch-control signal for switch 109-2 is (A1⊕A2), and so on. Generally, the switch-control signal for switch 109-$i$, where i denotes an integer, has the form $(A_{i-1} \oplus A_i)$. For a configuration that includes (m+2) switches, as shown in FIG. 2, switch 109-m has a switch-control signal in the form of $(A_{m-1} \oplus A_m)$.

Through nodes 106A-106B, switch network 109 provides currents received from switch network 106 to resistor network 112. More specifically, as noted above, decoder 121 decodes the MSB to generate control signals for the switches in switch network 109. In response to the control signals, the switches in switch network 109 couples nodes 106A and 106B to resistor network 112.

Thus, depending on the control signals, the currents flowing through nodes 106A-106B flow through selected parts of resistor network 112, as described below in detail. Switch network 109 couples nodes 106A-106B to resistor network 112 so as to maintain monotonicity of DAC 100. In response to the currents provided by switch network 109, resistor network 112 provides an analog output.

Resistor network 112 includes a plurality of resistors. In the embodiment shown in FIG. 2, resistor network 112 includes (m+1) resistors, labeled as R0 through Rm. Depending on the state of the switches in switch network 109, i.e., whether the respective switches conduct, current is provided to one or more of the resistors in resistor network 112. The flow of current develops a voltage across resistor network 112, which is provided via analog output 115.

Thus, DAC 100 develops an output voltage at analog output 115 in response to the digital input to DAC 100. Consider, for example, the situation where the digital input to DAC 100 is incremented to its maximum value, starting from all bits set to zero. In response, DAC 100 generates a signal at analog output 115, as described below.

When the MSB are set to zero, decoder 121 asserts signal A0 at its output. In response, driver 124 causes switch 109-0 and switch 109-1, which are coupled to resistor R0, to conduct. When the LSB are set to zero, decoder 118 asserts signals B0, B1, . . . , Bn (which results in de-assertion of signals B0b, B1b, . . . , Bnb).

Consequently, switches 106A1, 106B1, . . . , 106Bn conduct, and provide the output currents of current sources CS0-CSn to node 106A. The currents flowing into node 106A flow through switch 109-0 to circuit ground. As a result, DAC 100 provides zero volts at analog output 115.

As the LSB code increments, output currents of current sources CS0-CSn will sequentially be provided to node 106B via switch network 106. The currents provided to node 106B will then flow through resistor R0 to circuit ground, thus causing the output voltage at analog output 115 to increase.

When the output currents of all of current sources CS0-CSn have been provided to node 106B, the MSB code will begin to increment, e.g., it will change from 0 . . . 00 to 0 . . . 01. As a result, decoder 121 causes signal A1 to be asserted, and signal A0 to be de-asserted. The output voltage at analog output 115, however, will not change because at this point all of the currents are flowing through switch 109-1, which is controlled by the switch-control signal (A0⊕A1), provided by driver 124.

As the LSB code increments further, switches in switch network 106 change states in the reverse order. Put another way, the outputs of current sources CS0-CSn will sequentially flow to node 106A, rather than node 106B. Consequently, each code increment switches one LSB of current from the upper node of resistor R0 to the upper node of resistor R1. As a result, the output voltage at analog output 115 rises.

The above process repeats as the digital input to DAC 100 is incremented to the maximum code value (e.g., all binary 1s). At that point, all of the output currents of current sources CS0-CSn will flow into the upper node of resistor Rm. Thus, the output voltage at analog output 115 will have a value that corresponds to the maximum digital input applied to DAC 100.

The current-steering architecture described above maintains a constant current independent of the digital input provided to DAC 100. The DAC architecture maintains monotonicity because each step in the digital input removes one elemental current from current sources CS0-CSn from a given resistor in resistor network 112 and provides that current to the resistor above (e.g., from resistor R(m−1) to resistor Rm). As long as the current value does not decrease and as long as the resistor at issue has a positive resistance, the voltage at analog output 115 will rise in response to the code increment at the input of DAC 100.

In exemplary embodiments, driver 124 may be implemented in a variety of ways. For example, in some embodiments, driver 124 may include logic circuitry, such as OR gates, to generate switch-control signals for the switches in switch network 109. Driver 124, however, may be implemented in other ways. The choice of implementation depends on factors such as available technology, available die area, performance specifications, and the like, as person of ordinary skill in the art will understand.

Note that, similar to FIG. 1, in order to facilitate presentation FIG. 2 omits certain blocks of DAC 100. For example, the analog output of resistor network 112 may be coupled to a buffer or amplifier (not shown) to provide the analog output signal of DAC 100, which may be used to drive an external load. As another example, biasing circuitry is not shown in FIG. 2.

As noted above, decoder 118 and decoder 121 may be implemented or realized in a variety of ways, and may use a variety of configurations or topologies. In the embodiment shown in FIG. 2, decoder 118 may constitute a thermometer decoder, whereas decoder 121 constitutes a binary decoder. Other types and/or configurations of decoders may be used, as person of ordinary skill in the art will understand.

One aspect of the disclosure relates to the allocation of digital input bits in order to control switch network 106 versus switch network 109. In other words, the allocation of the digital input bits involves selecting or determining the relative values of m and n, which determine the number of current sources in current-source network 103 and the number of resistors in resistor network 112.

Considering an embodiment that uses a thermometer decoder as decoder 118 and a binary as decoder 121, allocation of bits, i.e., selection of the values of m and n, may be based on the properties of the decoders. Specifically, a thermometer decoder ordinarily has about twice the size of a binary decoder (i.e., it consumes twice the die area in an IC). If the resistor and current source element sizes are similar, then fewer bits may be allocated for the current sources. For example, using 6 bits for resistor network 112 and 5 bits for current-source network 103 yields decoders that have about the same size (i.e., the die areas used by decoder 118 and decoder 121 are about the same). (Note that DAC element sizes generally are selected based on integral nonlinearity (INL) and noise specifications for a given implementation of DAC 100.)

Another aspect of the disclosure relates to increasing the resolution of DAC 100 by making modifications to the switch networks. Specifically, the resolution of DAC 100 can be increased by controlling the gate voltages of the current-steering switches, rather than biasing them as simple current-steering switches. If both switches corresponding to a given current source (e.g., switches 106N1 and 106N2, corresponding to current source CSn) are turned on by setting their two gate voltages to be equal or nearly equal, the output current of the corresponding current-source (e.g., CSn in the preceding example) will divide evenly or nearly evenly between nodes 106A-106B. In other words, the switches are biased to conduct the output current of the corresponding current-source (e.g., CSn in the preceding example) evenly between them.

This configuration adds an additional bit of resolution to DAC 100, while preserving monotonicity. In exemplary embodiments, the digital control for the switches in switch network 106 may be implemented using an exclusive-OR (XOR) gate to determine which switches corresponding to a given current source the above control scheme is applied.

Note that, rather than controlling using XOR gates, other mechanisms and circuit arrangements may be used. For example, in some embodiments, the control mechanism may be built into the thermometer decoder. Note that additional biasing levels can add more bits of resolution, at the cost of losing monotonicity (or a deterioration in monotonicity). Thus, a tradeoff exists, which may be based on factors such as specifications for a given application, etc., as person of ordinary skill in the art will understand.

Figure 3:
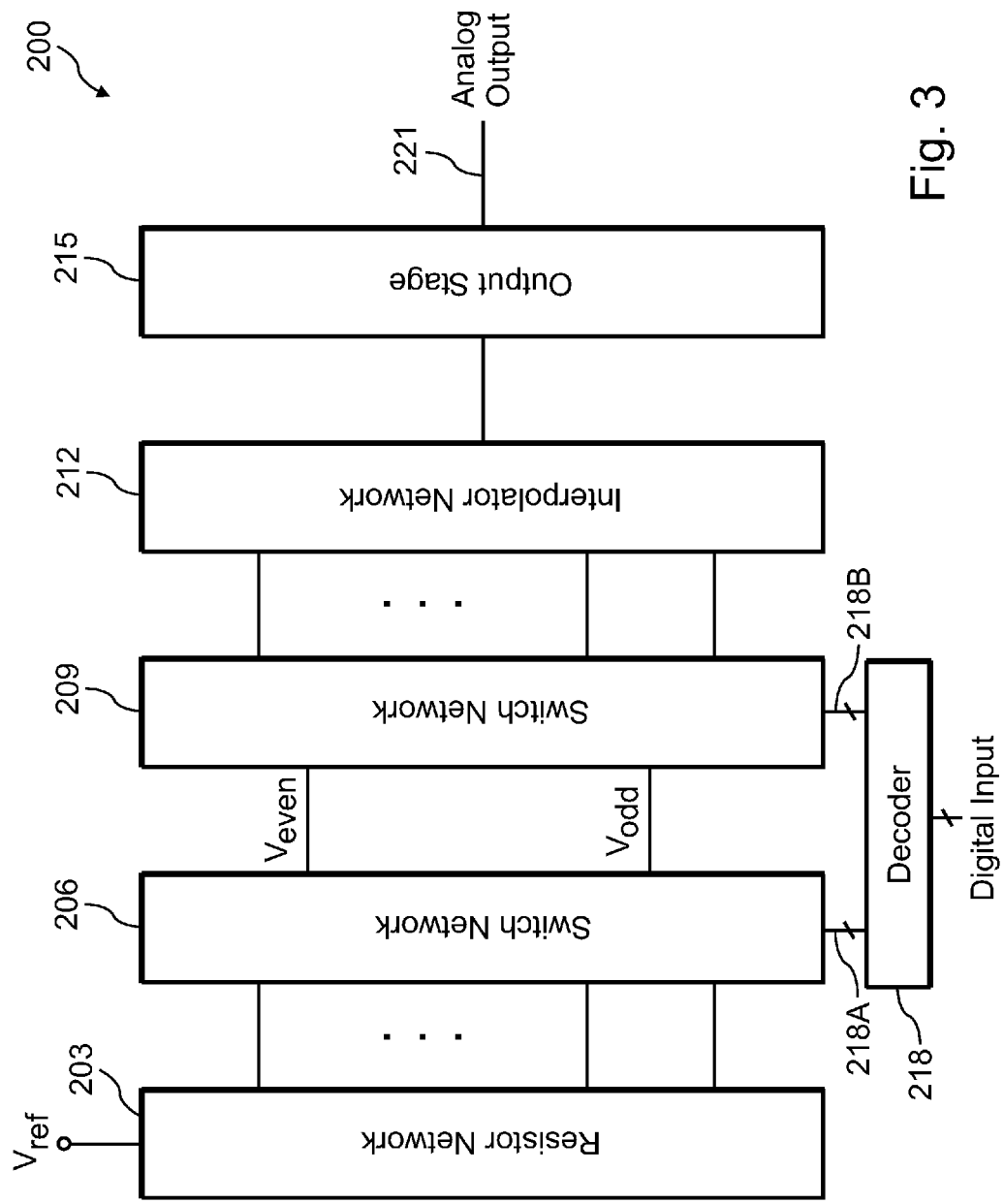
FIG. 3 shows a conceptual block diagram of a DAC architecture according to an exemplary embodiment.

In some applications, relatively low noise levels are desired. One aspect of the disclosure relates to DACs that provide relatively low noise levels (e.g., compared to conventional DACs), while preserving monotonicity. FIG. 3 shows a block diagram of a low-noise DAC 200 according to an exemplary embodiment.

DAC 200 includes resistor network 203, which includes a plurality of resistors, switch network 206, switch network 209, interpolator network 212, and output stage 215. In addition, DAC 200 includes decoder 218, which decodes the digital input applied to DAC 200 and generates control signals for switch network 206 and switch network 209.

Resistor network 203 is coupled to a reference voltage, $V_{ref}$. As a result, current flows through resistor network 203. The flow of current through resistor network 203 causes generation of a plurality of voltages, which are provided to switch network 206.

As noted, decoder 218 decodes the digital input to DAC 200, and generates control signals 218A for switch network 206. More specifically, control signals 218A are derived from the more significant bits (MSB) of the digital input to DAC 200. In response to control signals 218A, switch network 206 selectively couples the voltages from resistor network 203 to the nodes labeled as $V_{even}$ and $V_{odd}$. More specifically, based on control signals 218A, one voltage from resistor network 203 is coupled to node $V_{even}$ and one voltage is coupled to node $V_{odd}$.

Switch network 209 selectively couples nodes $V_{even}$ and $V_{odd}$ to interpolator network 212. In response, interpolator network 212 provides a signal, for example, a current, to output stage 215. Based on the signal from interpolator network 212, output stage 215 generates an output signal at analog output 221. In the embodiment shown, analog output 221 constitutes the output of DAC 200.

Switch network 209 operates in response to control signals 218B. More specifically, based on control signals 218B, switch network 209 selectively couples nodes $V_{even}$ and $V_{odd}$ to interpolator network 212. Decoder 218 decodes the digital input to DAC 200, and generates control signals 218B for switch network 209. Control signals 218B are derived from the less significant bits (LSB) of the digital input to DAC 200.

Overall, in response to the digital input, DAC 200 uses switching networks 206 and 206 to route two output signals derived from the outputs of resistor network 203 to interpolator network 212. Thus, DAC 200 may be considered as the combination or cascade of an RDAC (resistor network 203, driving switch network 206) that generates two outputs (at nodes $V_{even}$ and $V_{odd}$) coupled to drive an interpolator (interpolator network 212, driven by switch network 209).

In exemplary embodiments, interpolator network 212 may be implemented in a variety of ways. For example, in some embodiments, interpolator network 212 may use a plurality of transconductance ($g_m$) stages or amplifiers. Thus, interpolator network 212 may be a $g_m$-interpolator network.

Figure 4:
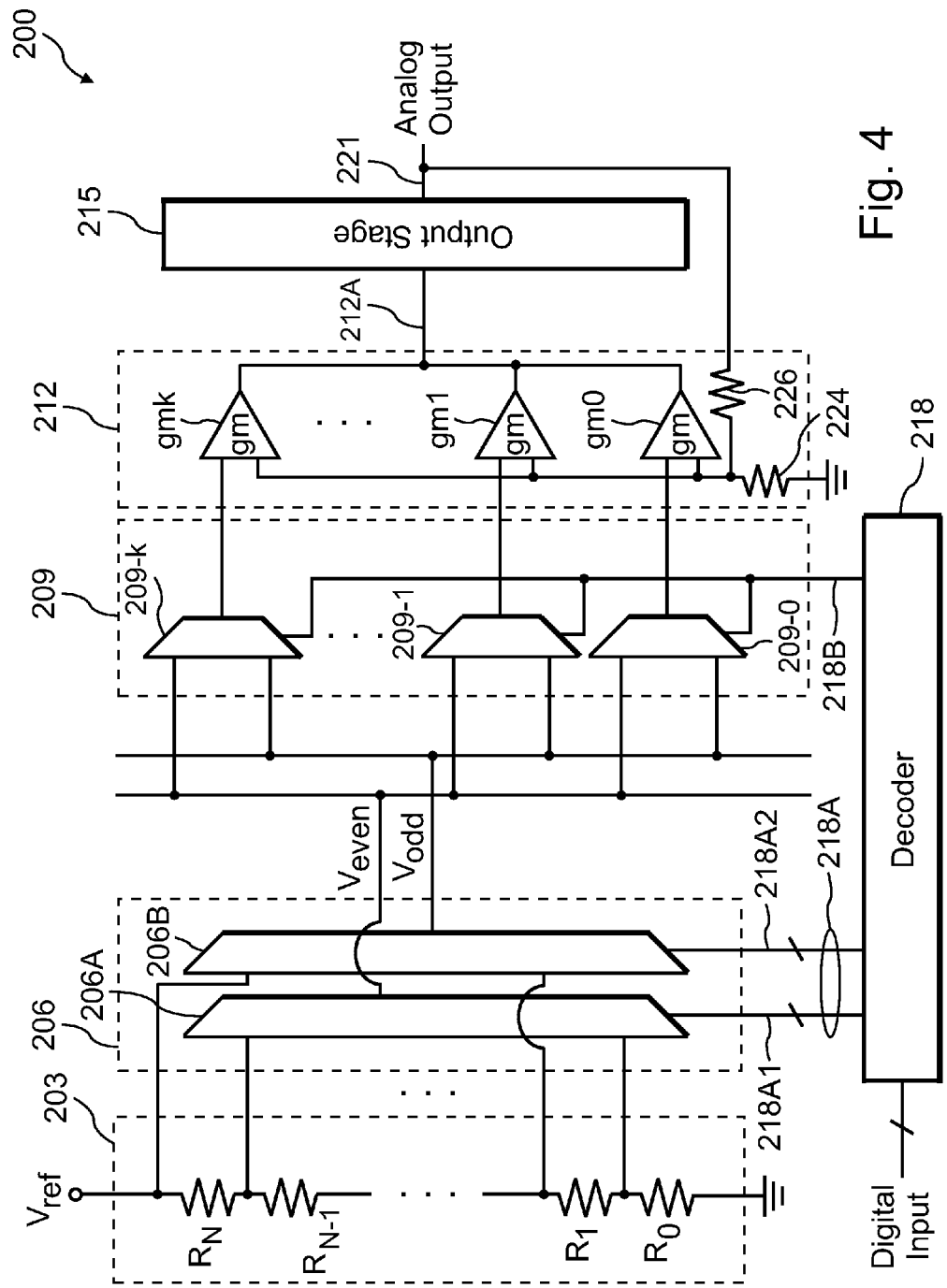
FIG. 4 depicts a circuit arrangement for a DAC according to an exemplary embodiment.

FIG. 4 depicts a circuit arrangement for a DAC 200 according to an exemplary embodiment. Similar to the embodiment shown in FIG. 3, DAC 200 in FIG. 4 includes resistor network 203, switch network 206, switch network 209, interpolator network 212, and output stage 215. In addition, DAC 200 includes decoder 218, which decodes the digital input applied to DAC 200 and generates control signals for switch network 206 and switch network 209.

Resistor network 203 includes a plurality of resistors, labeled as R0 through RN, coupled in series between a reference voltage ($V_{ref}$) and ground potential. In some embodiments, resistors R0-RN may have the same (or nearly same) resistance value. The application of the reference voltage to the resistors causes current to flow through the string of resistors. As a result, a plurality of voltage are formed across each respective resistor in the plurality of resistors in resistor network 203. The resulting plurality of voltages are fed to switch network 206.

Switch network 206 includes multiplexer (MUX) 206A and MUX 206B. MUXs 206A-206B operate in response to control signals 218A1-218A2, respectively. Resistors R0-RN are coupled to MUXs 206A-206B in an alternate manner. More specifically, the upper node of each resistor is alternately coupled to MUX 206A and MUX 206B. For example, the upper node of resistor R0 is coupled to an input of MUX 206A, whereas the upper node of resistor R1 is coupled to an input of MUX 206B, and so on.

Decoder 218 generates control signals 218A1-21A2 in response to the digital input applied as an input signal to DAC 200. Control signals 218A1-21A2 together form control signals 218A. Decoder 218 generates control signals 218A1-21A2 based on the values of the more significant bits (MSB) of the digital input to DAC 200. In other words, control signals 218A1-21A2 are derived from the MSB in order to control MUXs 206A-206B, respectively.

Control signals 218A1-21A2 cause MUXs 206A-206B to selectively couple resistors R0-RN to one of two nodes, labeled as $V_{even}$ and $V_{odd}$. Thus, based on the MSB, MUXs 206A-206B selectively provide the output voltages of resistor network 203 to nodes $V_{even}$ and $V_{odd}$. In the embodiment shown, each of the nodes $V_{even}$ and $V_{odd}$ is coupled through switch network 206 to half of the resistors in resistor network 203, and the coupling is interleaved. Thus, nodes $V_{even}$ and $V_{odd}$ span the range of the resistor string or ladder, but via different or alternating resistors, e.g., upper nodes of even-numbered resistors couple to the $V_{even}$ node, whereas upper nodes of odd-numbered resistors couple to the $V_{odd}$ node (or vice-versa).

Nodes $V_{even}$ and $V_{odd}$ couple to inputs of switch network 209. Switch network 209 includes MUXs 209-0 through 209-$k$. Node $V_{even}$ couples to one input of MUXs 209-0 through 209-$k$. Node $V_{odd}$ couples to another input of MUXs 209-0 through 209-$k$. The outputs of MUX 209-0 through 209-$k$ drive respective inputs of interpolator network 212.

Switch network 209 selectively couples nodes $V_{even}$ and $V_{odd}$ to interpolator network 212. Specifically, switch network 209 operates in response to control signals 218B. Thus, based on control signals 218B, switch network 209 selectively couples nodes $V_{even}$ and $V_{odd}$ to interpolator network 212.

Decoder 218 provides control signals 218B. Specifically, decoder 218 decodes the digital input to DAC 200, and generates control signals 218B for switch network 209. Control signals 218B are derived from the less significant bits (LSB) of the digital input to DAC 200.

Switch network 209 selectively couples nodes $V_{even}$ and $V_{odd}$ to interpolator network 212. In the embodiment shown, the interpolators in interpolator network 212 constitute a plurality of transconductance ($g_m$) stages or amplifiers, thus, a $g_m$-interpolator network. The $g_m$-interpolators in interpolator network 212 are labeled as $g_{m0}$ through $g_{mk}$.

As noted above, one input of each $g_m$-interpolator in interpolator network 212, e.g., the non-inverting input, is coupled to a respective output of a MUX among MUXs 209-0 through 209-$k$. Another input of the $g_m$-interpolators in interpolator network 212, e.g., the inverting input, is coupled to a feedback network that includes resistor 224 and resistor 226. Specifically, through resistor 224 and resistor 226, the $g_m$-interpolators in interpolator network 212 receive a signal related to (scaled down, in the embodiment shown in FIG. 4) the signal at analog output 221. By selecting appropriate values of resistor 224 and resistor 226, the overall gain of interpolator network 212 and output stage 215 may be programmed to a desired value.

In response to the outputs of MUXs 209-0 through 209-$k$, $g_m$-interpolators $g_{m0}$ through $g_{mk}$ provide output signals that are summed at node 212A to generate an output signal for interpolator network 212 (e.g., a current signal). The signal at node 212A drives an input of output stage 215. In response, output stage 215 generates an output signal at analog output 221. In the embodiment shown, analog output 221 constitutes the output of DAC 200.

Output stage 215 may be implemented in a variety of ways. For example, in some embodiments, output stage may include transconductance stage(s) and an amplifier, such as a class-AB amplifier. Output stage 215 provides an analog signal at analog output 221, which may drive an external load.

As with the DAC in FIG. 2, several bits of the digital input to DAC 200 may be allocated to controlling switch network 206, whereas the remaining bits may be allocated to driving switch network 209. For example, consider a 12-bit DAC according to an embodiment in which 5 bits of the digital input to the DAC implement the LSB of DAC 200. In such a DAC, the resistor string in resistor network 203 implements the 7 MSB (128 elements) of the DAC. In such an embodiment, MUX 206A and MUX 206B are controlled by 6-bit control or select signals 218A1 and 218A2, respectively.

The remaining 5 bits of the digital input to the DAC 200 implement the LSB. Thus, the DAC includes $2^5$, or 32, MUXs in switch network 209. The outputs of the 32 MUXs drive one input of the interpolators in interpolator network 212. In such an embodiment, interpolator network 212 includes 32 interpolators, i.e., k=31.

To illustrate the operation of such a DAC, note that MUX 206A and 206B couple taps in the resistor string in resistor network 203 to the $V_{even}$ and $V_{odd}$ nodes or buses. As the 7 MSB in the digital input to the DAC ramp from 0000000 to 1111111, the voltages from the resistor taps change in a "leapfrog" or alternating manner. FIG. 5 illustrates some of the voltages that appear at nodes $V_{even}$ and $V_{odd}$.

As the table in FIG. 5 illustrates, the voltages at nodes $V_{even}$ and $V_{odd}$ depend on the reference voltage, $V_{ref}$, and on the MSB input code (denoted under the column heading "Code"). Note that in response to the consecutive code changes, the voltages at nodes $V_{even}$ and $V_{odd}$ differ by a voltage of $(1/128) \cdot V_{ref}$, or $0.0078125 \sim V_{ref}$. If $V_{ref}$ has a value of 1.2 volts, then the difference between $V_{even}$ and $V_{odd}$ would be about 10 mV. Note that if the MSB code is even, $V_{odd}$ would be 10 mV higher than $V_{even}$. Conversely, if the MSB code has an odd value, then $V_{even}$ would be 10 mV higher than $V_{odd}$. By generating outputs ($V_{even}$ and $V_{odd}$) that depend on the input code and the value of the reference voltage, the combination of the resistor string and switch network (and corresponding decoder circuitry) may be considered as an RDAC.

Interpolator network 212 implements the lower 5 LSB in the example discussed above. As the name implies, interpolator network 212 uses the 32 $g_m$-interpolators to interpolate between the voltages at the $V_{even}$ and $V_{odd}$ nodes. As described above, control signals 218B, derived from the LSB in the digital input to the DAC, control which of the voltage at $V_{even}$ and the voltage at node $V_{odd}$ is provided to each of the respective interpolators in interpolator network 212.

To illustrate the operation of interpolator network 212, assume that the 7 MSB have the value 0000000, i.e., all zeros. In this case, $V_{even}$ is 0 V, and $V_{odd}$ has a value of about 10 mV (see FIG. 5). When the 5 LSB are all zeros (i.e., 00000), the 32 $g_m$-interpolators have their non-inverting inputs connected to $V_{even}$, i.e., 0 V or ground potential. Assuming that output stage 215 has a gain of 3 V/V, the signal at analog output 221 will have a zero-volt value (ground potential).

As the LSB ramp up or increment from 00000 to 11111, each increment of the code (LSB value) causes the input provided by switch network 209 to one of $g_m$-interpolators $g_{m0}$-$g_{mk}$ to switch from $V_{even}$ (0 V) to $V_{odd}$ ($\approx$10 mV). When the LSB are all binary 1s (a code of 11111), switch network 209 will provide $V_{odd}$ ($\approx$10 mV) as an input to 31 of the 32 $g_m$-interpolators. In this situation, the voltage at analog output 221 would have the value $3 \cdot (31/32) \cdot 10$ mV, or about 29 mV.

For LSB code values between 00000 and 11111, switch network 209 will provide the voltage at node $V_{even}$ to some of the $g_m$-interpolators, and the voltage $V_{odd}$ to the remaining $g_m$-interpolators. The signal at analog output 221 will therefore have an interpolated value between 0 V and about 29 mV, based on the fraction of $g_m$-interpolators that receive the voltage at node $V_{odd}$ as an input signal. The small voltage difference between $V_{even}$ and $V_{odd}$ provides for a linear or nearly linear interpolation by interpolator network 212.

When the 12-bit input (i.e., the digital input to the DAC) increments to the next value after 0000000 11111, the "leapfrog" or alternating property described above takes place. The 7 MSB in the digital input increment from 0000000 to 0000001, and the 5 LSB change from 11111 to 00000. Decoder 218 provides control signals 218B to MUXs 209-0 through 209-k, respectively, so that the incoming bits are transformed when the MSB code is odd, such that all 32 $g_m$-interpolators receive the voltage at node $V_{odd}$ as an input (which still has a value of $\approx$10 mV).

When the incoming LSB code in the DAC digital input increments to 00001, 31 $g_m$-interpolators remain coupled (via switch network 209) to receive an input the voltage at node $V_{odd}$, and one $g_m$-interpolator receives as an input the voltage node $V_{even}$, which now has a value of $\approx$20 mV instead of 0 V). In this way, as the incoming LSB increment further, more of the $g_m$-interpolator stages receive the voltage at node $V_{even}$ instead of the voltage at node $V_{odd}$. As a result, the interpolated signal (at output 212A) and, thus, the output signal at analog output 221, continues to rise. Eventually, all of the $g_m$-interpolators receive the voltage at node $V_{even}$ as an input. At that point, the MSB code increments again, and the process repeats.

Note that, although the DAC operation was described above with respect to a 12-bit DAC according to an exemplary embodiment, similar description and operation applies to DACs according to other exemplary embodiments. Thus, the concepts described may be applied to DACs with different resolutions, different numbers of elements, etc., as person of ordinary skill in the art will understand.

Figure 6:
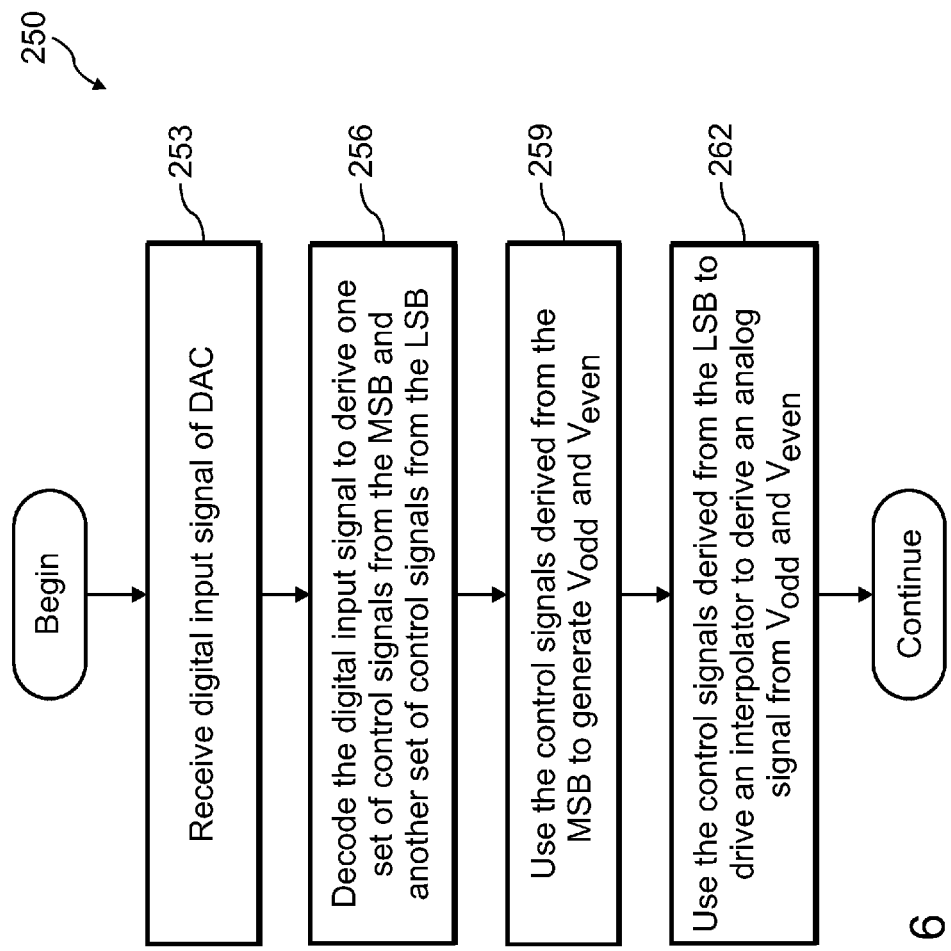
FIG. 6 depicts a process flow diagram for operation of a DAC according to an exemplary embodiment.

FIG. 6 depicts a process flow diagram for operation of a DAC according to an exemplary embodiment. At 253, a digital input signal provided to the DAC is received. At 256, the digital input signal is decoded to derive a set of control signals from the more-significant bits (MSB) of the digital input signal. Another set of control signals is derived from the less-significant bits (LSB) of the digital input signal.

At 259, the set of control signals derived from the MSB is used to drive an RDAC in order to generate $V_{odd}$ and $V_{even}$. At 262, the set of control signals derived from the LSB is used to drive an interpolator to derive an analog output signal from $V_{odd}$ and $V_{even}$. The analog output signal may be buffered or processed further, for example, by using an output stage, as described above.

DACs disclosed in connection with FIGS. 3-5 provide a number of benefits and advantages. One advantage relates to relatively low-noise operation, for example, compared to conventional DACs, while maintaining monotonicity and other attributes described above. Another advantage relates to the relative ease of setting a relatively precise gain for the DAC.

One aspect to the disclosure relates to gain selection or adjustment in electronic apparatus, such as DACs. The following description uses DACs as an example to illustrate the concepts, but as person of ordinary skill in the art will understand, the disclosed concepts may be applied to a variety of electronic apparatus with a selectable or adjustable gain.

Figure 7:
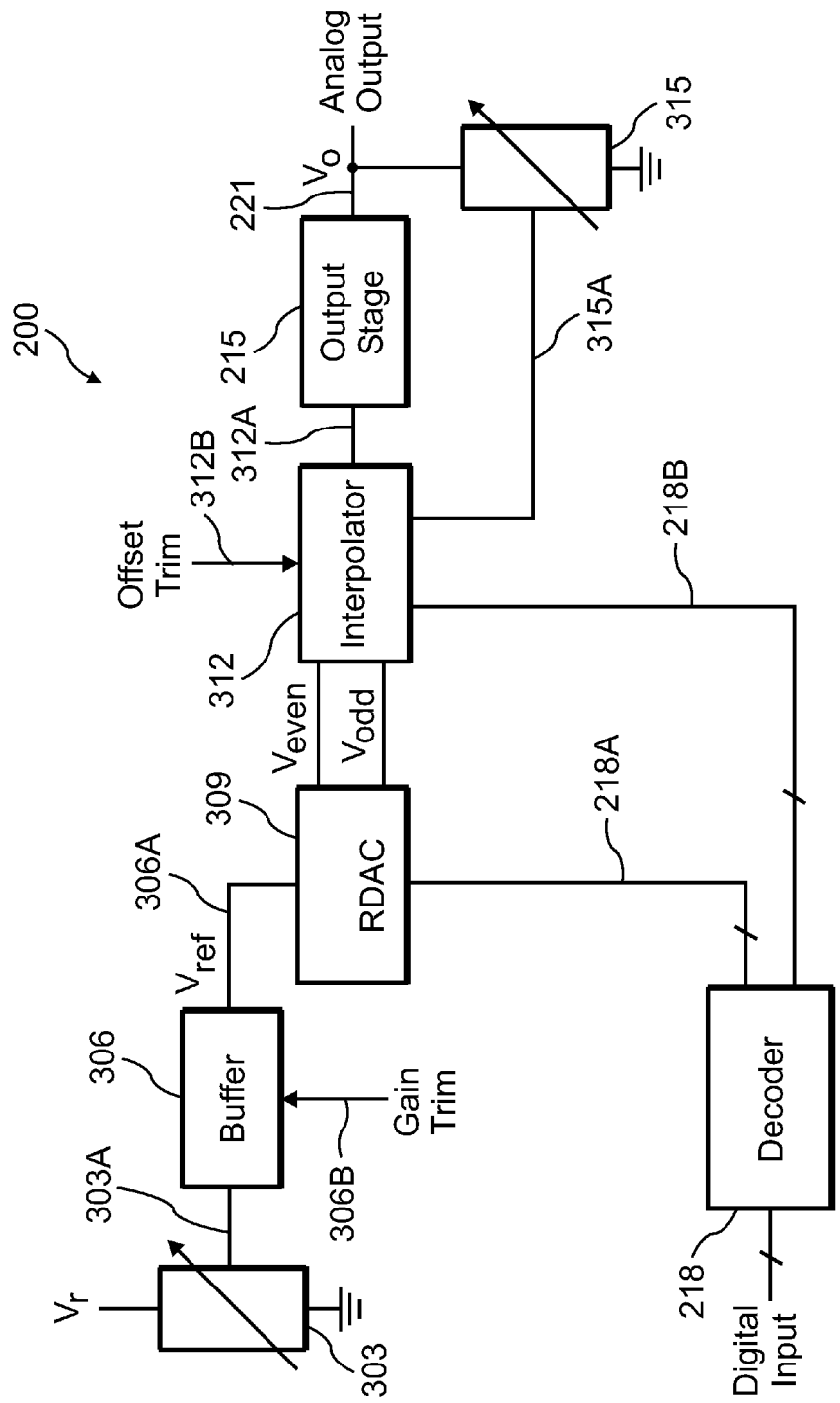
FIG. 7 illustrates a conceptual block diagram of a DAC architecture according to an exemplary embodiment.

As described above, the gain of DACs according to exemplary embodiments depends on the value of the reference voltage ($V_{ref}$). To illustrate the effect of various values, such as $V_{ref}$ and the gain of the output stage, on the overall DAC characteristics, FIG. 7 provides a conceptual block diagram of a DAC 200 according to an exemplary embodiment.

In the embodiment shown, the reference voltage used in the DAC (i.e., $V_{ref}$) may be a scaled or divided version of an original reference voltage ($V_r$). Alternatively or in addition, the original reference voltage may be applied externally to DAC 200, e.g., through a pin in an IC that includes DAC 200 that applies a voltage $V_{EXT}$ to DAC 200. A variety of sources may provide the voltage $V_{EXT}$, for instance, an external reference source, as person of ordinary skill in the art will understand. In such configurations, DAC 200 includes a mechanism for processing and using the signals provided by the reference sources to generate $V_{ref}$, as described below in detail.

In either case, by using an appropriate value for the scaling or division factor, an overall desired DAC gain value may be obtained. Scaling circuit 303 applies the desired scaling factor to $V_r$ in order to generate a scaled version at its output 303A, which is applied to buffer 306. The scaling factor of scaling circuit 303 may have a desired value or set of values, and may be programmable or adjustable, as desired. Buffer 306 provides buffering and/or amplification for the scaled version of $V_r$, and provides the DAC reference voltage, $V_{ref}$, at its output 306A. Buffer 306 has a gain trim input 306B that allows trimming of its gain.

The reference voltage $V_{ref}$ is applied to an RDAC 309, as described above. In response to control signals 218A and $V_{ref}$, RDAC 309 provides at its outputs the voltages $V_{even}$ and $V_{odd}$, as described above in detail. Decoder 218 provides control signals 218A by decoding the digital input signal applied to DAC 200, as noted above.

Interpolator 312 accepts the voltages labeled as $V_{even}$ and $V_{odd}$ as inputs. Interpolator 312 may include a switch network and a number of interpolator stages, as described above in detail. In response to control signals 218B, interpolator 312 develops an output voltage at output 312A as a function of the voltages $V_{even}$ and $V_{odd}$, as described above in detail. Decoder 218 provides control signals 218B by decoding the digital input signal applied to DAC 200, as noted above.

Interpolator 312 has an offset trim input 312B. A signal applied at input 312B may be used to trim an offset voltage of interpolator 312B. Doing so improves the overall performance of DAC 200, as person of ordinary skill in the art will understand. Output stage 215 receives the output signal of interpolator 215, and generates the analog output of DAC 200 at output 221, as described above in detail. In exemplary embodiments, output stage 215 may have programmable or adjustable gain. This feature allows setting the overall gain or full-scale voltage of DAC 200.

Scaling circuit 315 scales the analog output voltage of DAC 200 to generate a scaled version of $V_r$ at output 315A. The scaled voltage at output 315A is provided to interpolator 312 as a feedback signal derived from the output voltage of interpolator 312. The scaling factor of scaling circuit 315 may have a desired value or set of values, and may be programmable or adjustable, as desired. As a consequence, the effective gain of the output stage (more particularly, the overall gain of interpolators 312 and output stage 215) may be programmed to desired values.

Scaling down the voltage $V_r$ can provide a number of advantages, such as ease of implementation. In some embodiments, n-type MOS (nMOS) devices may be used in the switch networks (not shown in FIG. 7) in DAC 200. Scaling down Vr allows reducing or limiting the swing of the input voltages applied to the interpolator stages in interpolator 312. Furthermore, scaling the voltage $V_r$ allows programming or setting the overall gain or full-scale output voltage of DAC 200.

In exemplary embodiments, buffer 306 has a gain of unity, but the combination of buffer 306 and scaling circuit 303 may be used to provide programmable gain settings. The programmable gain settings may have a variety of desired values, for example, ½, 1/2.4, and ⅓. The programmable gain settings allow the setting or programming of the overall gain for DAC 200. As an example, consider a DAC having an output stage 215 with a gain of 3. If one desires the DAC to have an overall gain of unity, one may use a scaling factor of ⅓, for scaling circuit 303, i.e., $V_{ref}=(⅓) \times V_r$. The overall gain would have a value of ⅓×3, or unity.

Buffer 306 also has a gain-trim capability, which allows removing (or nearly removing) the output offset voltage of buffer 306. The output offset voltage, if not removed, would appear to the DAC as a gain error, and would deteriorate its performance. In exemplary embodiments, the trimming of the gain of buffer 306 can correct (or nearly correct) for temperature-change effects, power supply voltage variations, and the like.

Figure 8:
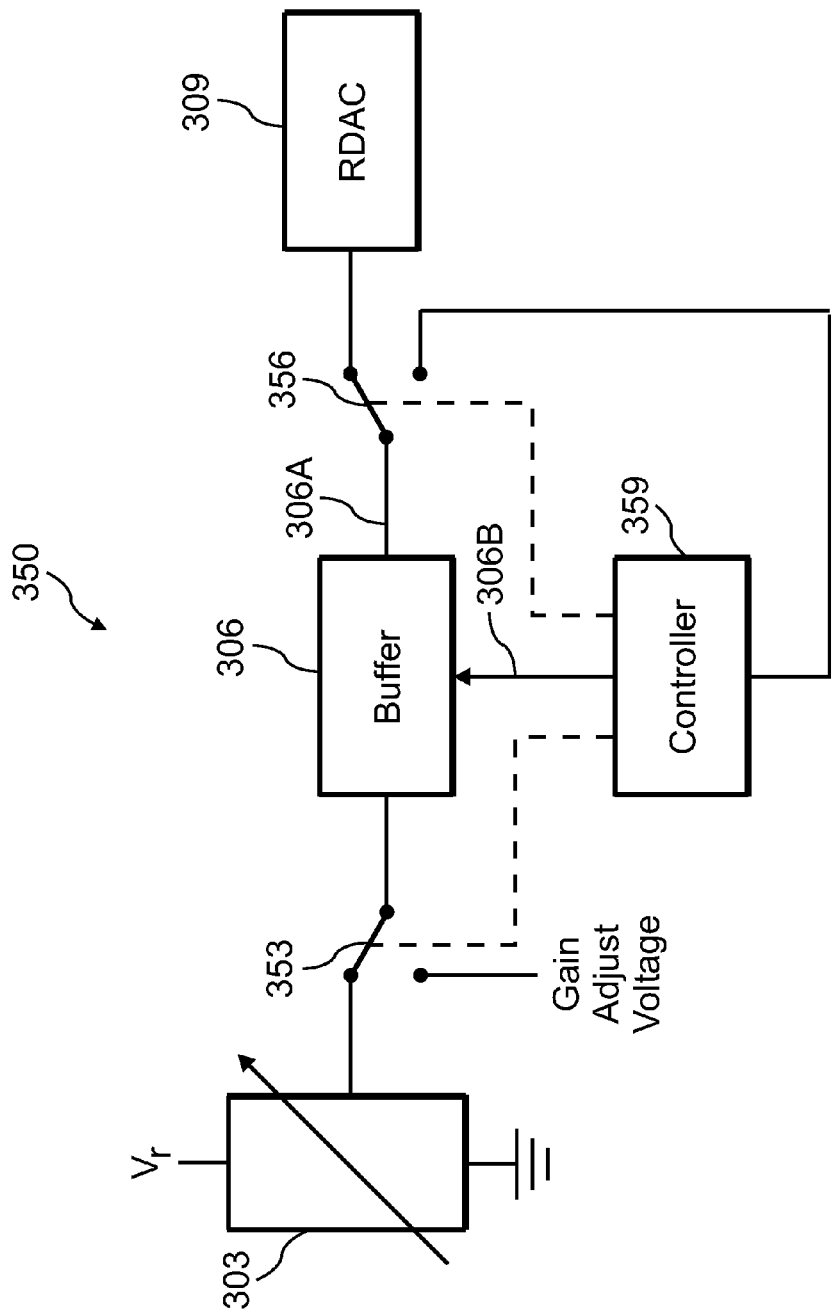
FIG. 8 shows a circuit arrangement for trimming the gain of a buffer according to an exemplary embodiment.

The trimming of the gain of buffer 306 may be performed in a number of ways. In some embodiments, the trimming is performed at production test, i.e., during post-fabrication testing. In some embodiments, the trimming is performed during use, for example, periodically or at power-up, and/or according to other schemes, as desired. FIG. 8 shows a circuit arrangement 350 for trimming the gain of buffer 306 according to an exemplary embodiment. (Other aspects of offset trimming are discussed below, in connection with FIG. 11.)

Referring to FIG. 8, the output signal of scaling circuit 303 is applied to switch 353. Use of switch 353 is optional. If used, under control of controller 359, switch 353 allows using selectively either the scaled version of $V_r$ or another gain-adjust voltage to trim the gain of buffer 306 (controller 359 or another part of the DAC may generate the voltages for gain trimming). The voltage selected via switch 353 is applied to the input of buffer 306. The output of buffer 306 is applied to switch 356. Under the control of controller 359, switch 356 can selectively provide output 306A of buffer 306 to either RDAC 309 or to controller 359.

During normal operation (i.e., when not trimming the gain of buffer 306), switch 356 couples output 306A to RDAC 309. During the gain-trim operation, switch 356 couples output 306A to controller 359. Depending on the actual and expected (based on the input voltage applied to buffer 306) output voltage of buffer 306, controller 359 applies one or more control signals to gain-trim input 360B of buffer 306. As a result, the gain of buffer 306 is trimmed to a desired value (e.g., unity in exemplary embodiments).

Note that in some embodiments, the user of the DAC (or other device, circuit, block, etc.) can cause controller 359 to perform gain trimming at one or more desired points in time, as noted above. Note further that in some embodiments the DAC may be configured to automatically perform gain trimming at one or more desired points in time, as desired, for example, during powering up or resetting of the DAC. Furthermore, a variety of other circuit arrangements are possible and contemplated. For example, in some embodiments, controller 359 may be implemented, in part or entirely, outside of the IC on which the DAC resides, such as in a production tester that performs operations such as testing and trimming after IC fabrication. In some embodiments, switch 353 and/or switch 356 may be omitted, for example, but using an additional or parallel input to buffer 306 (instead of switch 353), by sensing output of RDAC 309 (instead of using switch 356), etc., as person of ordinary skill in the art will understand.

Similarly, the output offset voltage of interpolator 312 may be trimmed. In exemplary embodiments, the trimming of the output offset voltage of interpolator 312 can correct (or nearly correct) for temperature-change effects, power supply voltage variations, and the like.

Figure 9:
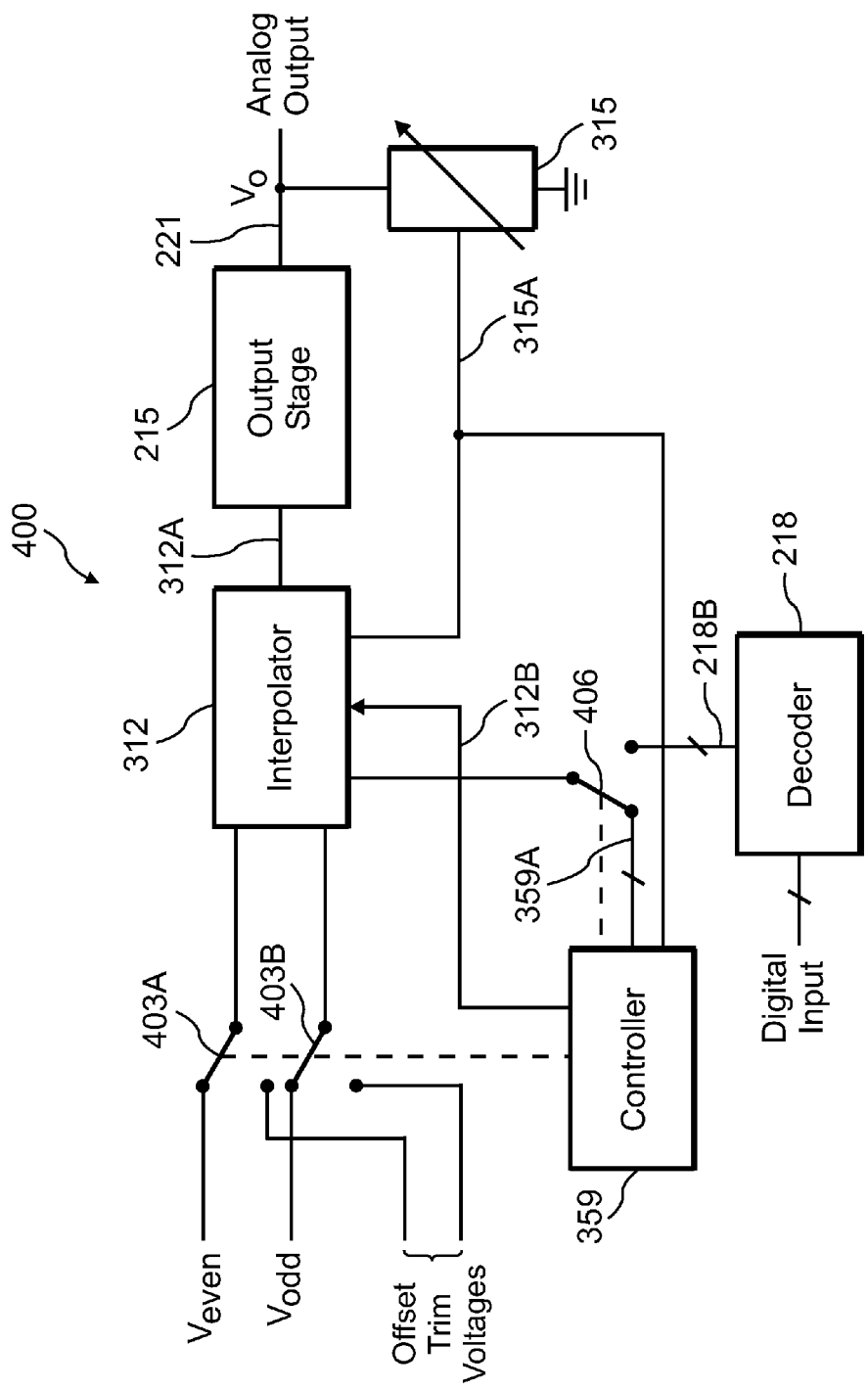
FIG. 9 illustrates a circuit arrangement for trimming interpolator offset voltage according to an exemplary embodiment.

The trimming of the output offset voltage of interpolator 312 may be performed in a number of ways. In some embodiments, the trimming is performed at production test, i.e., during post-fabrication testing. In some embodiments, the trimming is performed during use, for example, periodically or at power-up, and/or according to other schemes, as desired. FIG. 9 shows a circuit arrangement 400 for trimming interpolator offset voltage according to an exemplary embodiment. (Other aspects of offset trimming are discussed below, in connection with FIG. 11.)

Referring to FIG. 9, the voltages $V_{even}$ and $V_{odd}$ are applied to switches 403A and 403B, respectively. Note that use of switches 403A-403B is optional. If used, under control of controller 359, switches 403A-403B allow using selectively either the $V_{even}$ and $V_{odd}$ or another set of offset trim voltages to trim the offset of interpolator 312 (controller 359 or another part of the DAC may generate the voltages for offset trimming).

The voltages selected via switches 403A-403B are applied to the inputs of interpolator 312. The output of interpolator 312 is applied to scaling circuit 315, as described above. Output 315A of scaling circuit 315 is provided to controller 359. The output signal of scaling circuit 315 is used to trim the output voltage offset of interpolator 312.

Under the control of controller 359, switch 406 can selectively provide either control signals 218B (generated by decoder 218, as described above in detail) or control signals 359A generated by controller 359 (available at output 306A) to interpolator 312. Controller 359 generates control signals 359A based on the input signals to interpolator 312 to cause interpolator 312 to have a desired output voltage (e.g., 0 V) to determine and trim the output offset voltage of interpolator 312.

During normal operation (i.e., when not trimming the offset voltage of interpolator 312), switches 403A-403B couple the voltages $V_{even}$ and $V_{odd}$ to interpolator 312. Also, switch 406 provides control signals 218B (generated by decoder 218) to interpolator 312. Thus, the DAC responds to the digital input to generate an analog output signal, as described above.

During the offset-trim operation, however, switches 403A-403B couple either the $V_{even}$ and $V_{odd}$ or another set of offset trim voltages to trim the offset of interpolator 312, as described above. Furthermore, switch 406 provides control signals 359A to interpolator 312. Output 315A of scaling circuit 315 provides a scaled version of the output voltage of interpolator 312 to controller 359.

Depending on the actual and expected (based on the input voltages applied to interpolator 312) output voltage of interpolator 312 (or a scaled-down version at output 315A of scaling circuit 315), controller 359 applies one or more control signals to offset-trim input 312B of interpolator 312. As a result, the offset of interpolator 312 is trimmed to a desired value (e.g., zero or nearly zero).

Note that in some embodiments, the user of the DAC (or other device, circuit, block, etc.) can cause controller 359 to perform offset trimming at one or more desired points in time, as noted above. Note further that in some embodiments the DAC may be configured to automatically perform offset trimming at one or more desired points in time, as desired, for example, during powering up or resetting of the DAC. Furthermore, a variety of other circuit arrangements are possible and contemplated. For example, in some embodiments, controller 359 may be implemented, in part or entirely, outside of the IC on which the DAC resides, such as in a production tester that performs operations such as testing and trimming after IC fabrication. In some embodiments, switches 403A-403B and/or switch 406 may be omitted, for example, but using an additional or parallel input to interpolator 312 (instead of switches 403A-403B), by sensing the voltage at output 221 and applying a correction voltage via 312B to adjust the offset voltage of interpolator 312 (instead of using switch 406), etc., as person of ordinary skill in the art will understand.

A variety of alternative configurations to the circuit arrangements in FIGS. 8-9 are possible and are contemplated. For example, in some embodiments, some or all of the functionality of decoder 218 may be combined with the functionality of controller 359, or vice-versa. The choice of circuit arrangement used in a particular application depends on factors such as specifications for that application, as person of ordinary skill in the art will understand.

As noted above, in exemplary embodiments, more than one source may be used to generate the reference voltage $V_{ref}$. Doing so involves using switches that allow selecting the source. The switches have finite parasitic elements, such as parasitic resistance (e.g., on-state resistance). In addition, as noted above, changing the value of $V_{ref}$ causes the overall gain or the output full-scale value of the DAC to change.

To maintain or provide a desired gain or full-scale value, the effective gain of the output stage may be programmed or set to values that correspond to the selected $V_{ref}$ values. The effective gain of the output stage (the overall gain of the interpolators and output stage 215) may be programmed via scaling circuit 315. Programming the effective gain of output stage involves using switches in scaling circuit 315. Those switches also have finite parasitic elements, such as parasitic resistance (e.g., on-state resistance). One aspect of the disclosure relates to gain and offset trimming or adjustment in electronic apparatus, such as DACs.

Figure 10:
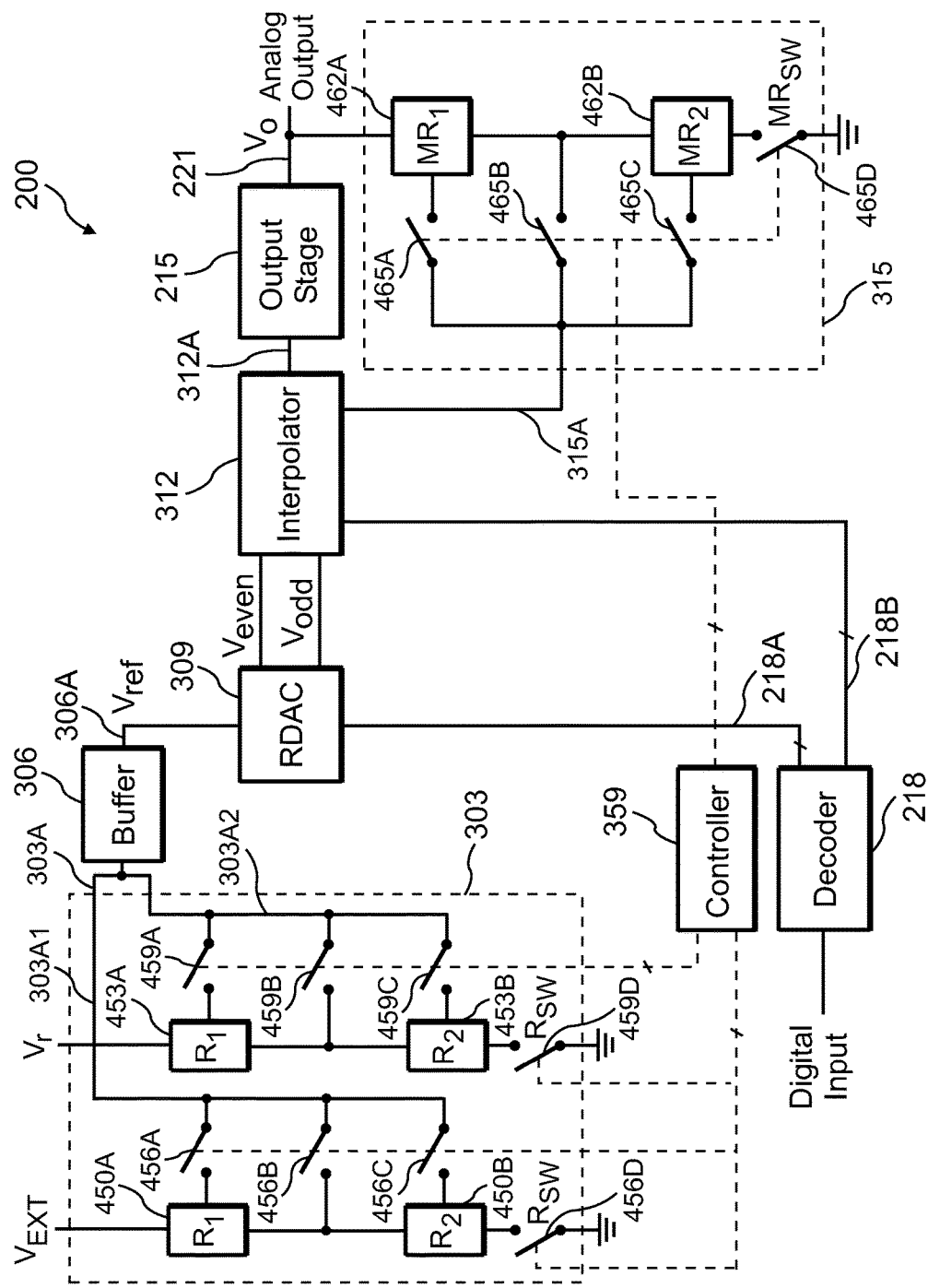
FIG. 10 depicts a circuit arrangement for a DAC according to an exemplary embodiment that compensates for parasitic elements.

One aspect of the disclosure relates to compensating for parasitic elements or effects, such as the parasitic resistance of switches, described above, in electronic apparatus, such as DACs. FIG. 10 depicts a circuit arrangement for a DAC 200 according to an exemplary embodiment that compensates for parasitic elements.

DAC 200 in FIG. 10 includes some of the same or similar blocks or circuits shown in FIG. 7. Scaling circuit 303 in FIG. 10 provides a mechanism for selecting one or two sources for generating $V_{ref}$. In the embodiment shown, an external voltage ($V_{EXT}$) from a source external to DAC 200 or another voltage V, (e.g., an internally generated source) may be used to generate $V_{ref}$.

The voltage $V_{EXT}$ is applied to tapped resistors 450A-450B, having resistance values of $R_1$ and $R_2$, respectively. Switch 456D couples resistor 450B to ground. Switch 456D allows the disruption of current flow from $V_{EXT}$ to ground through resistors 450A-450B when the respective part of scaling circuit 303 is not used, or when DAC 200 is not used, etc., which results in reduced power consumption. Controller 359 controls the operation of switch 456D.

Taps in resistors 450A-450B are coupled to switches 456A and 456C, respectively. Switch 456B couples to one end or terminal of resistor 450A and one end of resistor 450B. Controller 359 controls the operation of each of switches 456A-456C. For instance, controller 359 can cause switches 456A-456B to be open and switch 456C to be closed. By controlling the switches, controller 359 can cause a programmable or desired fraction of the voltage $V_{EXT}$ to be provided at output 303A1 of scaling circuit 303.

Similarly, the voltage $V_r$ is applied to resistors 453A-453B, having resistance values of $R_1$ and $R_2$, respectively. Switch 459D couples resistor 453B to ground. Switch 459D allows the disruption of current flow from $V_r$ to ground through resistors 453A-453B when the respective part of scaling circuit 303 is not used, or when DAC 200 is not used, etc., which results in reduced power consumption. Controller 359 controls the operation of switch 459D.

Taps in resistors 453A-4530B are coupled to switches 459A and 459C, respectively. Switch 459B couples to one end or terminal of resistor 453A and one end of resistor 453B. Controller 359 controls the operation of each of switches 459A-459C. For instance, controller 359 can cause switches 459A-459B to be open and switch 459C to be closed. By controlling the switches, controller 359 can cause a programmable or desired fraction of the voltage $V_r$ to be provided at output 303A2 of scaling circuit 303. Outputs 303A1 and 303A2 feed the input of buffer 306, as shown.

As described above, scaling circuit 315 provides a mechanism for providing a scaled version of the output signal (available at output 221) of output stage 215, denoted as $V_o$, to interpolator 312. The voltage $V_o$ is applied to resistors 462A-462B, having resistance values of $M \cdot R_1$ and $M \cdot R_2$, respectively, where M denotes a positive integer. Switch 465D couples resistor 462B to ground. Switch 465D allows the disruption of current flow from $V_o$ to ground through resistors 462A-462B when the respective part of scaling circuit 303 is not used, or when DAC 200 is not used, etc., which results in reduced power consumption. Controller 359 controls the operation of switch 465D.

Taps in resistors 462A-462B are coupled to switches 465A and 465C, respectively. Switch 465B couples to one end or terminal of resistor 462A and one end of resistor 462B. Controller 359 controls the operation of each of switches 465A-465C. For instance, controller 359 can cause switches 465A-465B to be open and switch 465C to be closed. By controlling the switches, controller 359 can cause a programmable or desired fraction of the voltage $V_o$ to be provided to interpolator 312, in effect programming the gain of the output stage of DAC 200.

In practical implementations, the circuit arrangement shown in FIG. 10 includes various parasitic elements, such as the parasitic resistance of switches 456A-456D, 459A-459D, and 465A-465D. The parasitic resistances of switches 456D, 459D, and 465D can cause an error when setting the gain or full-scale output value of DAC 200. By properly sizing the sizes of the elements in scaling circuits 303 and 315, the error may be canceled or nearly canceled.

Specifically, the respective resistances of resistors 462A-462B are larger than the resistances of resistors 450A-450B by a factor of M, as described above. In addition, assuming that switches 456D and 459D have parasitic resistances of $R_{sw}$, switch 465D is scaled or sized to have a parasitic resistance of $M \cdot R_{sw}$. This choice of the component sizes and values cancels or nearly cancels the gain error discussed above, provided that the effective gain of the output stage (i.e., the overall gain of interpolator 312 and output stage 215), $G_{out}$, is the reciprocal of the effective gain of the reference-voltage gain-setting circuit (i.e., the overall gain of scaling circuit 303 and buffer 306), $G_{ref}$.

The following equation expresses the overall gain of DAC 200 in such a scenario:

$$G_{ref} \cdot G_{out} = \{(R_2 + R_{sw})/(R_1 + R_2 + R_{sw}) \cdot \{1 + (M \cdot R_1)/((M \cdot R_2) + (M \cdot R_{sw}))\} \quad [\text{Eq. 1}].$$

Note that if the reciprocal condition described above is met, then $G_{ref} \cdot G_{out} = 1$.

Furthermore, note that if $G_{ref}$ and $G_{out}$ are not set to reciprocal values, then the gain error will be partly canceled. Thus, the more closely the values of $G_{ref}$ and $G_{out}$ are set to be reciprocals of each other, the better the cancellation of the gain error.

The above techniques for canceling gain error because of parasitic elements has been described with respect to DACs. The concepts, however, may be applied to other electronic apparatus by making modifications that person of ordinary skill in the art will understand.

Figure 11:
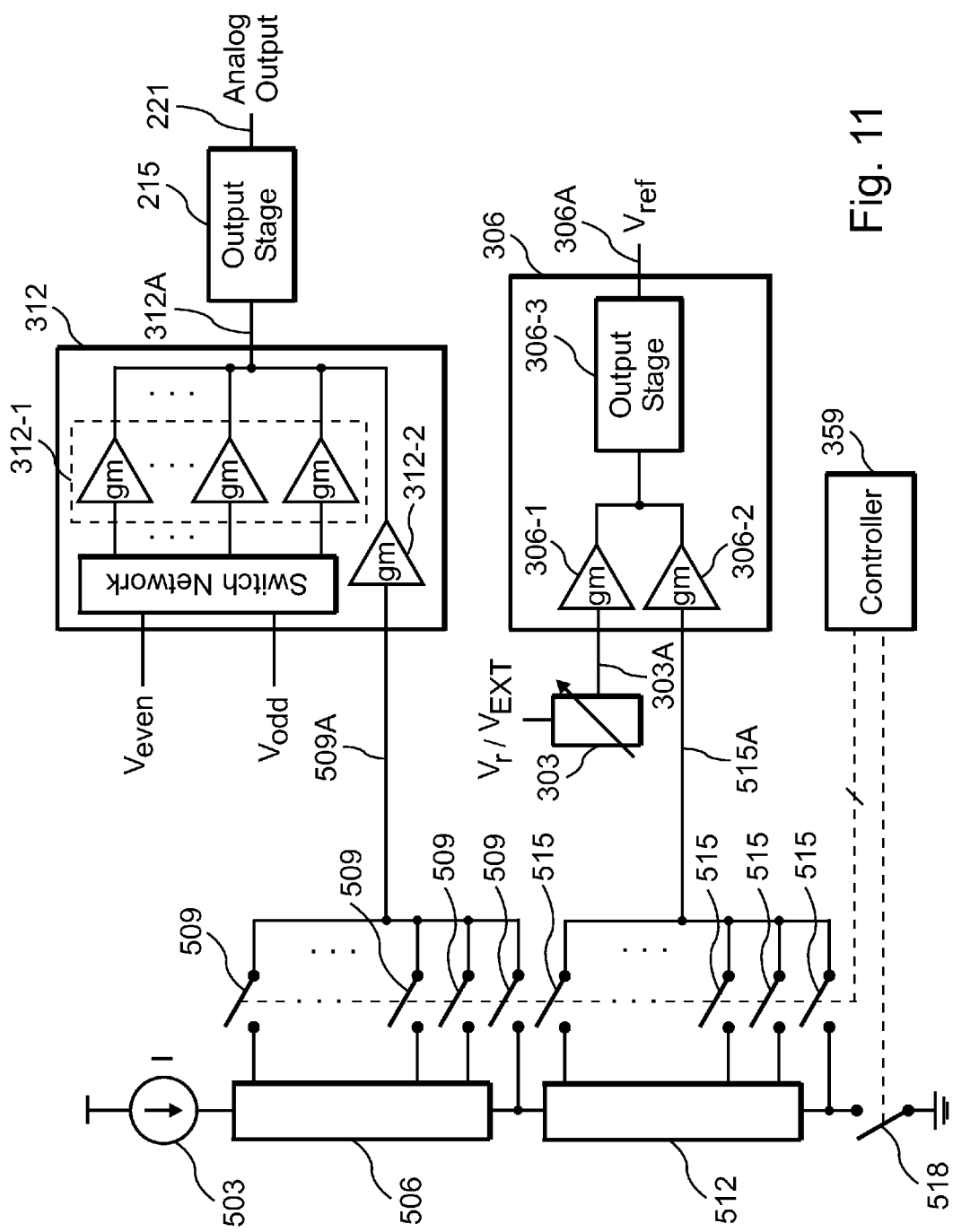
FIG. 11 shows a circuit arrangement for providing offset trimming in a DAC according to an exemplary embodiment.

Another aspect of the disclosure relates to trimming or correcting various offset errors in electronic apparatus, such as DACs. FIG. 11 shows a circuit arrangement for providing offset trimming in a DAC according to an exemplary embodiment. A constant-current source 503 provides a current I to resistor 506 and resistor 512, coupled as a resistor string. The flow of current through resistor 506 and resistor 512 results in voltage levels used to trim offset.

More specifically, resistor 506 and resistor 512 have a number of taps. For example, in some embodiments, resistor 506 may have 31 taps, and resistor 512 may have 31 taps, although other numbers of taps may be used, as person of ordinary skill in the art will understand. The taps in resistor 506 are coupled to switches 509. The lower end or terminal of resistor 506 may be used as an additional tap, and is coupled to one of switches 509. Thus, the flow of current through resistor 506 provides a number of voltage levels available through the taps in resistor 506.

Switches 509 selectively couple the taps of resistor 506 to node 509A. Controller 359 controls the operation of switches 509. Specifically, controller 359 may cause one or more of switches 509 to turn on. In this manner, controller 359 can provide a number of voltage levels to node 509A. For example, by turning on a single one of switches 509, controller 359 can cause the voltage level at the tap coupled to that switch to be available at node 509A.

Similarly, the taps in resistor 512 are coupled to switches 515. The lower end or terminal of resistor 512 may be used an additional tap, and is coupled to one of switches 515. Thus, the flow of current through resistor 512 provides a number of voltage levels available through the taps in resistor 512.

Switches 515 selectively couple the taps of resistor 512 to node 515A. Controller 359 controls the operation of switches 515. Specifically, controller 359 may cause one or more of switches 515 to turn on. In this manner, controller 359 can provide a number of voltage levels to node 515A. For example, by turning on a single one of switches 515, controller 359 can cause the voltage level at the tap coupled to that switch to be available at node 515A.

Switch 518 couples resistor 509 to ground. Thus, switch 518 allows the disruption of current flow from current source 503 to ground through resistors 506 and 509 when the offset trimming functionality is not used, or when the DAC is not used, etc., which results in reduced power consumption. Controller 359 controls the operation of switch 518.

The voltage at node 509A is used to trim an output offset of interpolator 312. More specifically, the voltage at node 509A drives an input of a transconductance ($g_m$) stage or amplifier 312-2. The output current of $g_m$-stage 312-2 is provided to output 312A of interpolator 312. As described above, interpolator 312 includes a number of $g_m$-stages (labeled as 312-1) that receive the voltages $V_{even}$ and $V_{odd}$ via a switch network. In response, $g_m$-stages 312-1 generate output currents that collectively are provided to output 312A of interpolator 312.

In other words, the current available at output 312A of interpolator 312 constitutes the sum of the currents provided by $g_m$-stages 312-1 and the current provided by $g_m$-stage 312-2. By changing the magnitude and/or polarity of the current provided by $g_m$-stage 312-2, the output offset of interpolator 312 and, hence, the output offset voltage of the DAC, may be trimmed or canceled or nearly canceled.

In exemplary embodiments, $g_m$-stage 312-2 has a lower current-drive or drive capability (or strength) or transconductance value than do $g_m$-stages 312-1. As a result, $g_m$-stage 312-2 injects smaller currents into node 312A than do $g_m$-stages 312-1. Put another way, the output offset of interpolator 312 may be trimmed with finer granularity.

As noted above, the trimming of the output offset voltage of interpolator 312 may be performed in a number of ways. In some embodiments, the trimming is performed at production test, i.e., during post-fabrication testing. Based on the results, control levels for switches 509 may be stored (e.g., in a memory) for further retrieval and use for trimming the offset of interpolator 312. Furthermore, as described above, in some embodiments, the trimming is performed during use, for example, periodically or at power-up, and/or according to other schemes, as desired.

Referring to FIG. 11, the voltage at node 515A is used to trim an output offset of buffer 306. Trimming the output offset of buffer 306 provides gain trimming for the overall DAC.

The voltage at node 515A is used to trim an output offset of interpolator 312. More specifically, the voltage at node 515A drives an input of a transconductance ($g_m$) stage or amplifier 306-2. The output current of $g_m$-stage 306-2 is provided to output 306A of buffer 306. Buffer 306 also includes $g_m$-stage 306-1 that receives a voltage from output 303A of scaling circuit 303. In response, $g_m$-stage 306-1 generates an output current that is converted by output stage 306-3 into $V_{ref}$.

In other words, the current available at output 306A of buffer 306 constitutes the sum of the currents provided by $g_m$-stage 306-1 and the current provided by $g_m$-stage 306-2. By changing the magnitude and/or polarity of the current provided by $g_m$-stage 306-2, the output offset of buffer 306 and, hence, the overall gain of the DAC, may be trimmed.

In exemplary embodiments, $g_m$-stage 306-2 has a lower current-drive or drive capability (or strength) or transconductance value than does $g_m$-stage 306-1. As a result, $g_m$-stage 306-2 injects smaller currents into node 306A than does $g_m$-stage 306-1. In other words, the output offset of buffer 306 may be trimmed with finer granularity.

As noted above, the trimming of the output offset voltage of buffer 306 may be performed in a number of ways. In some embodiments, the trimming is performed at production test, i.e., during post-fabrication testing. Based on the results, control levels for switches 515 may be stored (e.g., in a memory) for further retrieval and use for trimming the offset of buffer 306. Furthermore, as described above, in some embodiments, the trimming is performed during use, for example, periodically or at power-up, and/or according to other schemes, as desired.

Figure 12:
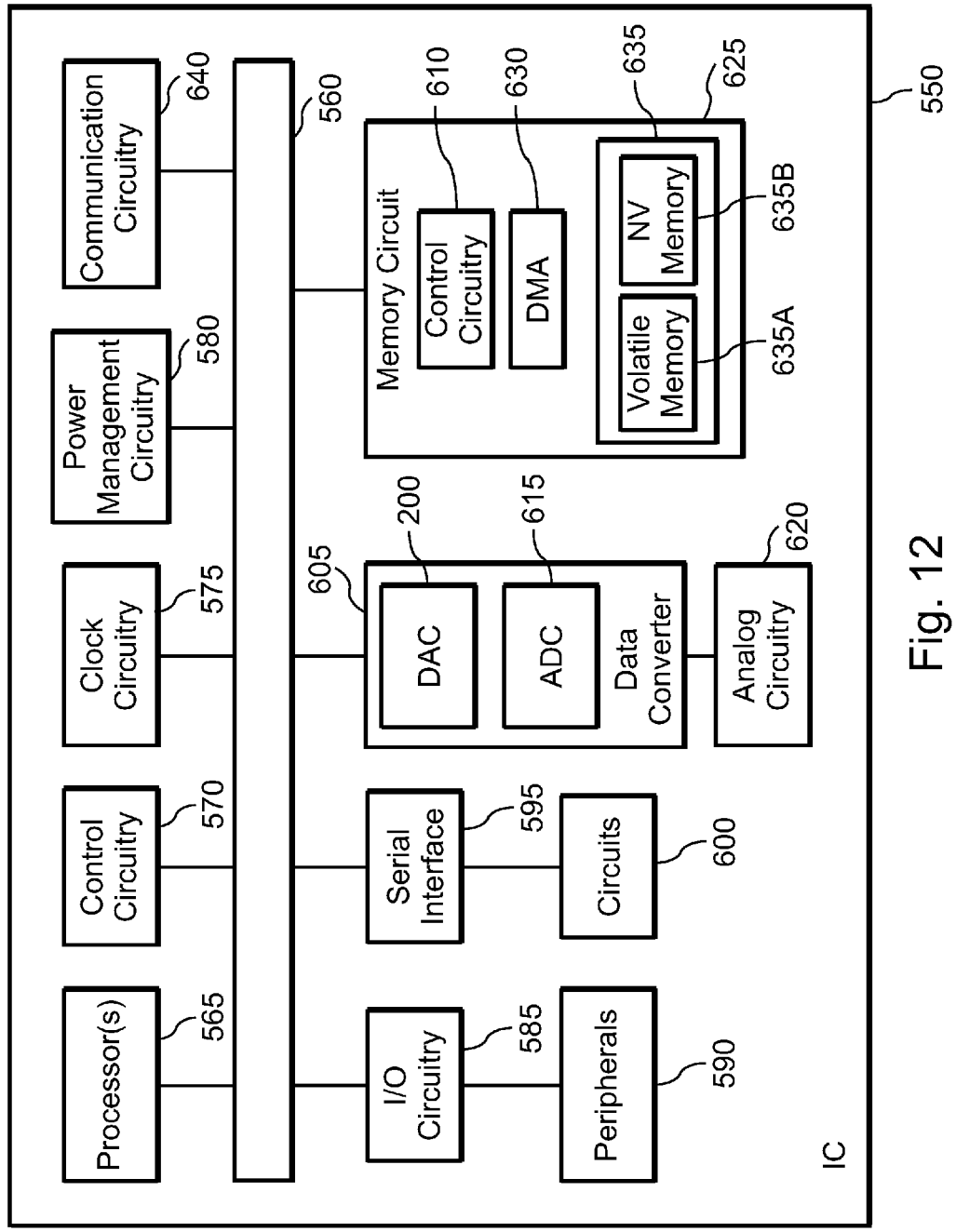
FIG. 12 illustrates an integrated circuit (IC) that combines a DAC with other circuit blocks according to an exemplary embodiment.

DACs according to exemplary embodiments may be combined with other circuitry, for example, by integrating the DAC and signal processing or computing circuitry within an IC. FIG. 12 illustrates an integrated circuit (IC) 550, for example, a microcontroller unit (MCU), that combines a DAC with other circuit blocks according to an exemplary embodiment.

IC 550 includes a number of blocks (e.g., processor(s) 565, data converter 605, I/O circuitry 585, etc.) that communicate with one another using a link 560. In exemplary embodiments, link 560 may constitute a coupling mechanism, such as a bus, a set of conductors or semiconductors for communicating information, such as data, commands, status information, and the like.

IC 550 may include link 560 coupled to one or more processors 565, clock circuitry 575, and power management circuitry 580. In some embodiments, processor(s) 565 may include circuitry or blocks for providing computing functions, such as central-processing units (CPUs), arithmetic-logic units (ALUs), and the like. In some embodiments, in addition, or as an alternative, processor(s) 565 may include one or more digital signal processors (DSPs). The DSPs may provide a variety of signal processing functions, such as arithmetic functions, filtering, delay blocks, and the like, as desired.

Clock circuitry 575 may generate one or more clock signals that facilitate or control the timing of operations of one or more blocks in IC 550. Clock circuitry 575 may also control the timing of operations that use link 560. In some embodiments, clock circuitry 575 may provide one or more clock signals via link 560 to other blocks in IC 550.

In some embodiments, power management circuitry 580 may reduce an apparatus's (e.g., IC 550) clock speed, turn off the clock, reduce power, turn off power, or any combination of the foregoing with respect to part of a circuit or all components of a circuit. Further, power management circuitry 580 may turn on a clock, increase a clock rate, turn on power, increase power, or any combination of the foregoing in response to a transition from an inactive state to an active state (such as when processor(s) 565 make a transition from a low-power or idle or sleep state to a normal operating state).

Link 560 may couple to one or more circuits 600 through serial interface 595. Through serial interface 595, one or more circuits coupled to link 560 may communicate with circuits 600. Circuits 600 may communicate using one or more serial protocols, e.g., SMBUS, I²C, SPI, and the like, as person of ordinary skill in the art will understand.

Link 560 may couple to one or more peripherals 590 through I/O circuitry 585. Through I/O circuitry 585, one or more peripherals 590 may couple to link 560 and may therefore communicate with other blocks coupled to link 560, e.g., processor(s) 365, memory circuit 625, etc.

In exemplary embodiments, peripherals 590 may include a variety of circuitry, blocks, and the like. Examples include I/O devices (keypads, keyboards, speakers, display devices, storage devices, timers, etc.). Note that in some embodiments, some peripherals 590 may be external to IC 550. Examples include keypads, speakers, and the like.

In some embodiments, with respect to some peripherals, I/O circuitry 585 may be bypassed. In such embodiments, some peripherals 590 may couple to and communicate with link 560 without using I/O circuitry 585. Note that in some embodiments, such peripherals may be external to IC 550, as described above.

Link 560 may couple to analog circuitry 620 via data converter 605. Data converter 405 may include one or more ADCs 615 and/or one or more DACs 200. The ADC(s) 615 receive analog signal(s) from analog circuitry 620, and convert the analog signal(s) to a digital format, which they communicate to one or more blocks coupled to link 560.

Conversely, DAC(s) 200 receive one or more digital signals from one or more blocks coupled to link 560, and convert the digital signal(s) to an analog format. The analog signal(s) may be provided to circuitry within (e.g., analog circuitry 620) or circuitry external to IC 550, as desired.

Analog circuitry 620 may include a wide variety of circuitry that provides and/or receives analog signals. Examples include sensors, transducers, and the like, as person of ordinary skill in the art will understand. In some embodiments, analog circuitry 620 may communicate with circuitry external to IC 550 to form more complex systems, sub-systems, control blocks, and information processing blocks, as desired.

Control circuitry 570 couples to link 560. Thus, control circuitry 570 may communicate with and/or control the operation of various blocks coupled to link 560. In addition or as an alternative, control circuitry 570 may facilitate communication or cooperation between various blocks coupled to link 560. In some embodiments, the functionality or circuitry of control circuits in DAC 200 (e.g., controller 359 described above) may be combined with or included with the functionality or circuitry of control circuitry 570, as desired.

Referring again to FIG. 12, in some embodiments, control circuitry 570 may initiate or respond to a reset operation. The reset operation may cause a reset of one or more blocks coupled to link 560, of IC 550, etc., as person of ordinary skill in the art will understand. For example, control circuitry 570 may cause DAC(s) 200 to reset to an initial state.

In exemplary embodiments, control circuitry 570 may include a variety of types and blocks of circuitry. In some embodiments, control circuitry 570 may include logic circuitry, finite-state machines (FSMs), or other circuitry to perform a variety of operations, such as the operations described above.

Communication circuitry 640 couples to link 560 and also to circuitry or blocks (not shown) external to IC 550. Through communication circuitry 640, various blocks coupled to link 560 (or IC 550, generally) can communicate with the external circuitry or blocks (not shown) via one or more communication protocols. Examples include universal serial bus (USB), Ethernet, and the like. In exemplary embodiments, other communication protocols may be used, depending on factors such as specifications for a given application, as person of ordinary skill in the art will understand.

As noted, memory circuit 625 couples to link 560. Consequently, memory circuit 625 may communicate with one or more blocks coupled to link 560, such as processor(s) 365, control circuitry 570, I/O circuitry 585, etc. In the embodiment shown, memory circuit 625 includes control circuitry 610, memory array 635, and direct memory access (DMA) 630.

Control circuitry 610 controls or supervises various operations of memory circuit 625. For example, control circuitry 610 may provide a mechanism to perform memory read or write operations via link 360. In exemplary embodiments, control circuitry 610 may support various protocols, such as double data rate (DDR), DDR2, DDR3, and the like, as desired.

In some embodiments, the memory read and/or write operations involve the use of one or more blocks in IC 550, such as processor(s) 565. DMA 630 allows increased performance of memory operations in some situations. More specifically, DMA 630 provides a mechanism for performing memory read and write operations directly between the source or destination of the data and memory circuit 625, rather than through blocks such as processor(s) 565.

Memory array 635 may include a variety of memory circuits or blocks. In the embodiment shown, memory array 635 includes volatile memory 635A and non-volatile (NV) memory 635B. In some embodiments, memory array 635 may include volatile memory 635A. In some embodiments, memory array 635 may include NV memory 635B.

NV memory 635B may be used for storing information related to performance or configuration of one or more blocks in IC 550. For example, NV memory 635B may store configuration information related to offset or gain trimming of DAC(s) 200, as described above.

DACs according to exemplary embodiments, having advantages such as described above, may prove beneficial in a variety of applications. Examples include applications that specify some or all of the attributes listed above, such as monotonicity and relatively high resolution, for example, 12 bits.

Figure 13:
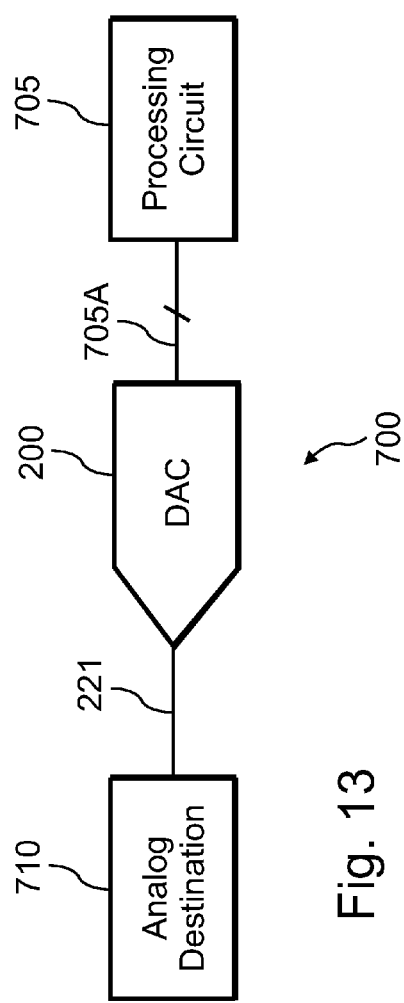
FIG. 13 depicts a circuit arrangement for information processing using a DAC according to an exemplary embodiment.

One example application includes data processing applications that process analog input signals, as circuit arrangement 700 in FIG. 13 depicts. More specifically, a processing circuit 705 (or generally a source of digital signals, for example, an MCU, a CPU, microprocessor, etc.) provides at output 705A a digital signal. The digital signal is provided to DAC 200. DAC 200 converts the digital signal to an analog signal, which it provides at output 221. The analog signal is fed to analog destination 710 (e.g., a transducer, driver, amplifier, and the like). Thus, a source of digital information, such as processing circuit 705 can control or communicate with analog destination 710 using DAC 200.

Figure 14:
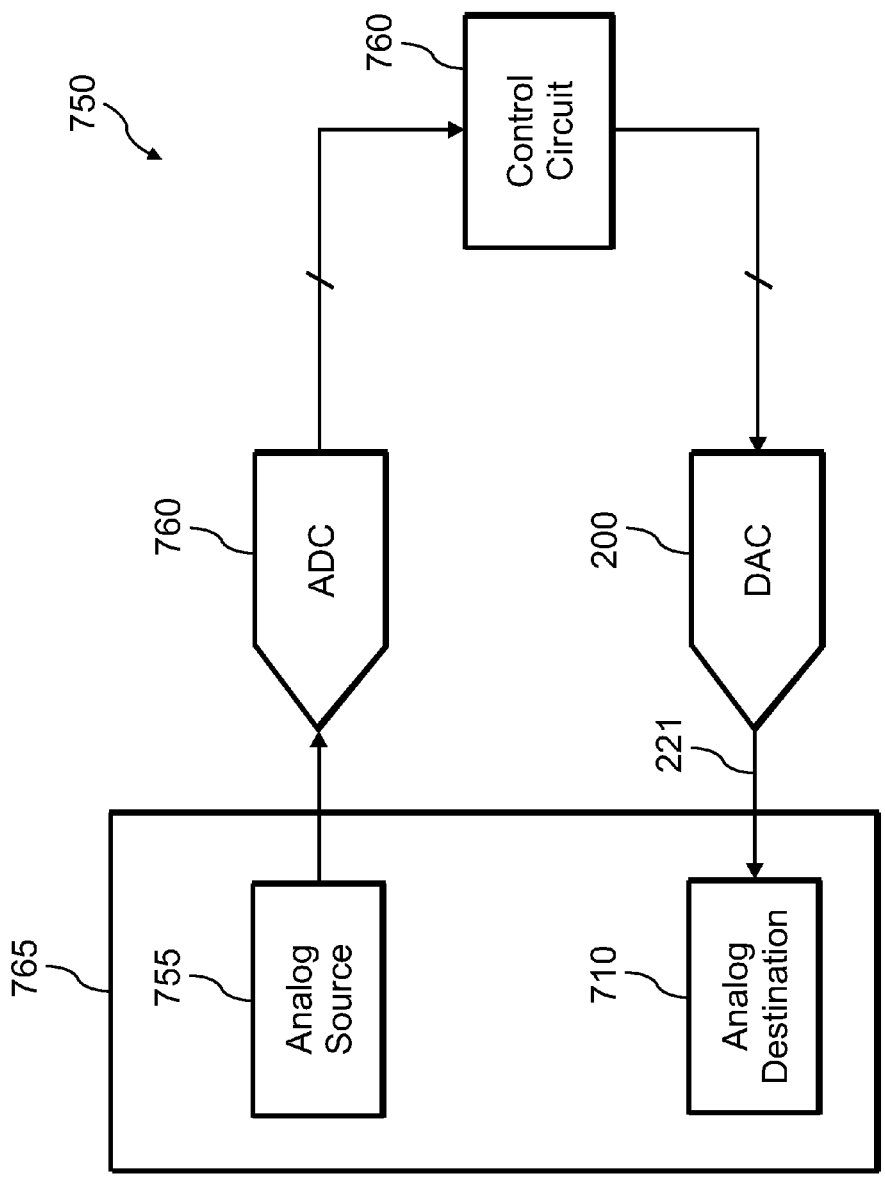
FIG. 14 shows a control system that uses a DAC according to an exemplary embodiment.

In another application, DACs according to exemplary embodiments may be used to implement a control system 750, as FIG. 14 shows. Control system 750 includes a process 765, which includes analog source 755 and analog destination 710. Analog source 755, for example, a sensor or transducer, provides an analog signal to ADC 760. ADC 760 converts the analog signal to a digital signal, which it provides to control circuit 760.

Control circuit 760 processes the digital signal, for example, by filtering, amplifying or scaling, delaying, and the like. Control circuit 760 provides a digital output signal that it provides to DAC 200. DAC 200 converts the digital output signal of control circuit 760 to an analog signal, which is available at output 221. The analog signal at the output of DAC 200 is provided to analog destination, e.g., a transducer, driver, motor, or other electromechanical device, etc. Thus, the combination of the blocks shown in system 750 implement a feedback control loop.

Figure 15:
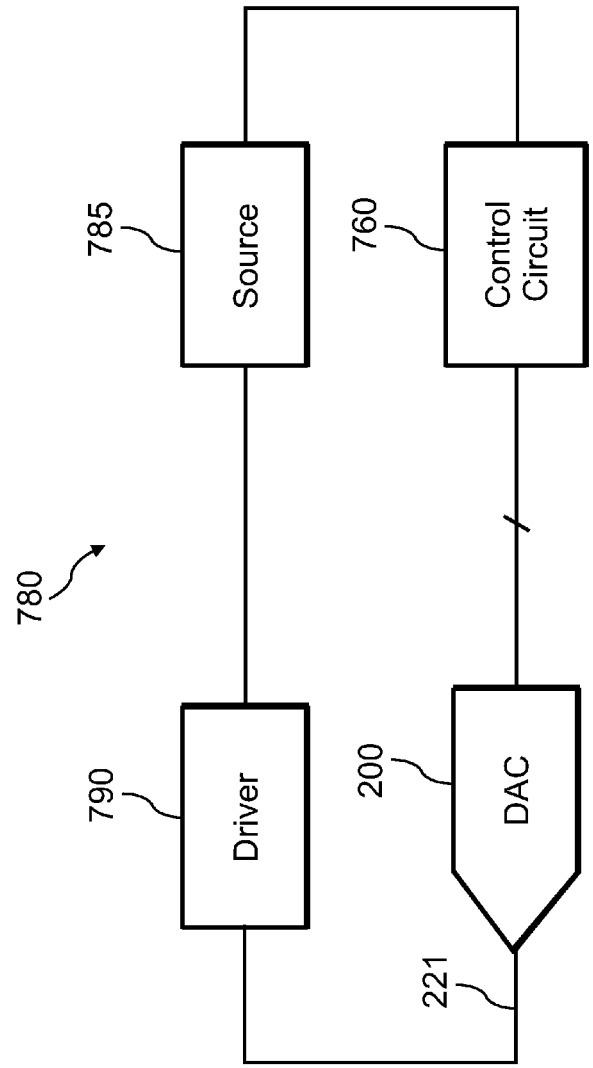
FIG. 15 illustrates a circuit arrangement with a feedback loop with a DAC according to an exemplary embodiment.

Generally, applications that use one or more DACs in a feedback loop (e.g., a servo) may benefit from using DACs according to various embodiments. FIG. 15 illustrates a circuit arrangement 780 that shows such a configuration. More specifically, the feedback loop includes a source 785 that provides an output signal to a control circuit 760. In response, control circuit 760 generates a digital signal that it provides to DAC 200.

DAC 200 converts the digital signal received from control circuit 760 to generate an analog signal at output 221. The analog output signal of DAC 200 feeds driver 790. Driver 790 drives source 785 (e.g., by providing one or more drive signals), which completes the loop.

Figure 16:
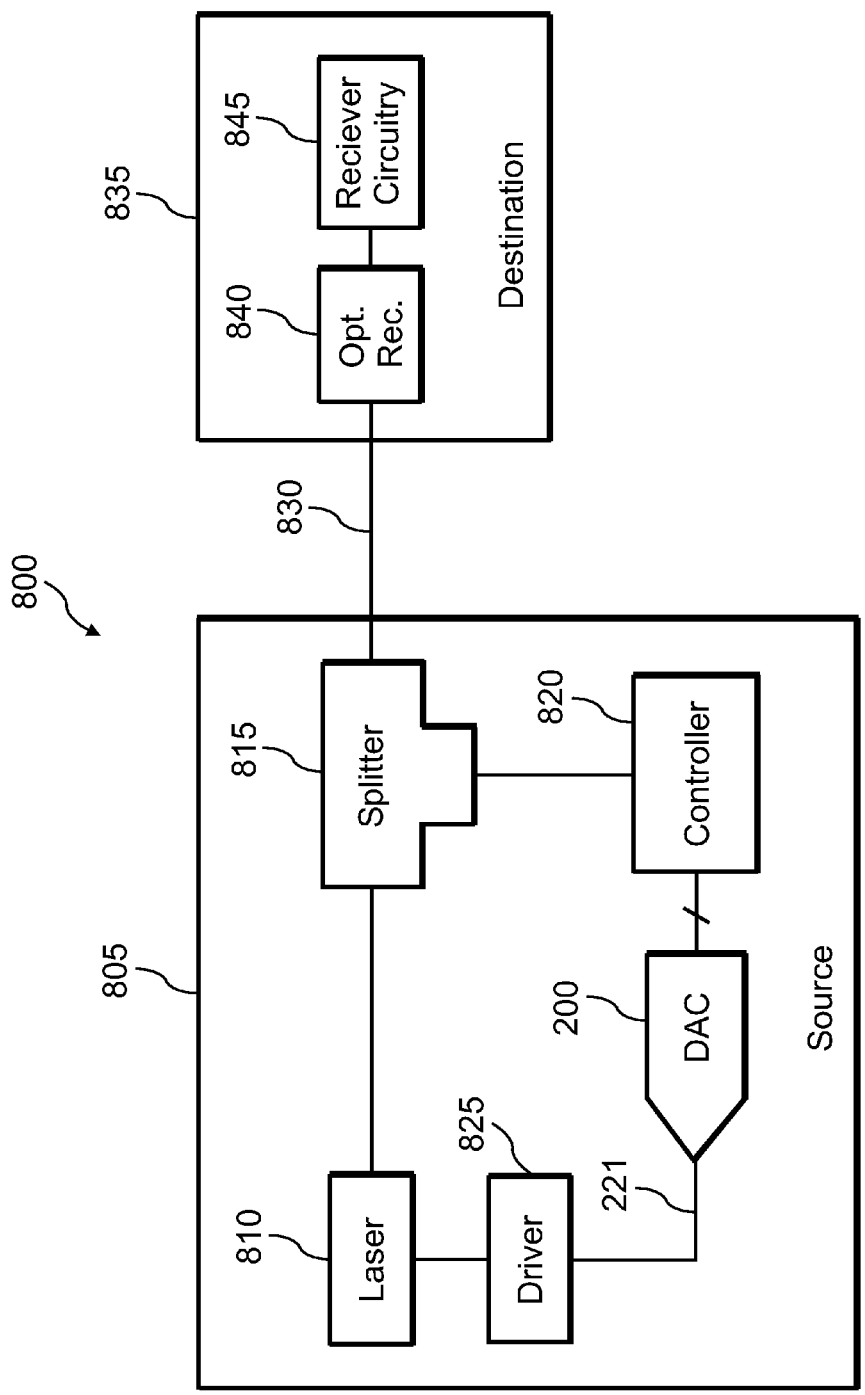
FIG. 16 depicts a communication system that uses a DAC according to an exemplary embodiment.

A more specific example of a feedback loop that employs a DAC according to an exemplary embodiment may be a communication system. More specifically, the DAC may be used in a feedback loop to control the intensity of a light source used in an optical communication system. FIG. 16 shows such a communication system 800 that uses this scheme.

More specifically, communication system 800 includes a source 805, a medium 830, and a destination 835. Source 805, often a transmitter (or transceiver), provides information signals to medium 830, e.g., an optical fiber or a collection of optical fibers. Medium 830 provides the information to destination 835, often a receiver (or transceiver), and often located remotely to source 805.

In the embodiment shown, source 805 includes laser 810, which generates a light beam that it provides to splitter 815. Note that the light beam from laser 810 is typically modulated (e.g., turned on and off according to a digital bit pattern) with information, using additional circuit blocks (not shown). Splitter 815 provides a portion of the input light from laser 810 to medium 830, which provides the light to destination 835, as described above.

In addition, splitter 815 provides a portion of the input light from laser 810 to controller 820. In other words, controller 820 receives a light signal that indicates the strength of the light beam output from laser 810. In response to the input light from splitter 815, controller 820 generates a digital signal that ultimately is used to drive laser 810.

More specifically, DAC 200 coverts the digital signal from controller 820 into an analog signal that it provides at output 221. The analog output signal of DAC 200 feeds driver 825. In response, driver 825 provides a bias to laser 810 to cause it to provide its output light beam with a desired intensity.

As noted, by receiving a signal from splitter 815, controller 820 receives a measure of the strength of the light beam that laser 810 provides. By comparing the signal from splitter 815 with a reference signal, controller 820 provides the digital signal to DAC 200 that ultimately causes driver 825 to either increase or decrease the bias provided to laser 810 in order to regulate the intensity of the output light from laser 810.

Referring to the figures, persons of ordinary skill in the art will note that the various blocks shown might depict mainly the conceptual functions and signal flow. The actual circuit implementation might or might not contain separately identifiable hardware for the various functional blocks and might or might not use the particular circuitry shown. For example, one may combine the functionality of various blocks into one circuit block, as desired. Furthermore, one may realize the functionality of a single block in several circuit blocks, as desired. The choice of circuit implementation depends on various factors, such as particular design and performance specifications for a given implementation. Other modifications and alternative embodiments in addition to those described here will be apparent to persons of ordinary skill in the art. Accordingly, this description teaches those skilled in the art the manner of carrying out the disclosed concepts, and is to be construed as illustrative only. Where applicable, the figures might or might not be drawn to scale, as persons of ordinary skill in the art will understand.

The forms and embodiments shown and described should be taken as illustrative embodiments. Persons skilled in the art may make various changes in the shape, size and arrangement of parts without departing from the scope of the disclosed concepts in this document. For example, persons skilled in the art may substitute equivalent elements for the elements illustrated and described here. Moreover, persons skilled in the art may use certain features of the disclosed concepts independently of the use of other features, without departing from the scope of the disclosed concepts.

The invention claimed is:

1. An apparatus comprising:
   a digital-to-analog converter (DAC) to convert a digital input signal to an analog output signal, the DAC comprising:
   a decoder to decode the digital input signal and to provide first and second sets of control signals;
   a resistor DAC (RDAC) to provide first and second voltages in response to the first set of control signals; and
   an interpolator coupled to receive the first and second voltages and to provide a first analog signal in response to the second set of control signals.

2. The apparatus according to claim 1, wherein the DAC provides the analog output signal with monotonicity.

3. The apparatus according to claim 1, wherein the RDAC comprises a resistor network coupled to a first switch network, the first switch network comprising a first set of switches controlled by the first set of control signals.

4. The apparatus according to claim 3, wherein the first set of control signals are generated by the decoder by decoding more-significant bits (MSB) of the digital input signal.

5. The apparatus according to claim 4, wherein the decoder comprises a binary decoder to decode the MSB of the digital input signal to generate the first set of control signals.

6. The apparatus according to claim 1, wherein the interpolator comprises a second switch network coupled to a plurality of interpolator stages, the second switch network comprising a second set of switches controlled by the second set of control signals.

7. The apparatus according to claim 6, wherein the second set of control signals are generated by the decoder by decoding less-significant bits (LSB) of the digital input signal.

8. The apparatus according to claim 7, wherein the decoder comprises a thermometer decoder to decode the LSB of the digital input signal to generate the first set of control signals.

9. The apparatus according to claim 6, further comprising an output stage coupled to the interpolator to receive the first analog signal and to provide the analog output signal.

10. An apparatus comprising:
    a digital-to-analog converter (DAC) comprising:
    a current-source network comprising a plurality of current sources to provide a plurality of currents;
    a first switch network to selectively provide the plurality of currents provided by the plurality of current sources to a first node or a second node;
    a resistor network coupled to provide an output signal, the resistor network comprising a plurality of resistors; and
    a second switch network coupled to the resistor network to selectively couple resistors in the plurality of resistors of the resistor network to the first and second nodes.

11. The apparatus according to claim 10, wherein the DAC provides the output signal with monotonicity.

12. The apparatus according to claim 10, wherein the first switch network comprises a plurality of pairs of switches coupled to respective current sources in the current-source network to selectively provide to the first node or the second node the currents provided by the plurality of current sources.

13. The apparatus according to claim 10, wherein the first switch network comprises a pair of switches coupled to receive a current from a current source in the current-source network, the current flowing evenly in the pair of switches in order to increase a resolution of the DAC.

14. The apparatus according to claim 10, wherein the resistor network is coupled between an output of the DAC and a ground node of the DAC.

15. A method of converting a digital signal to an analog signal, the method comprising:
  decoding the digital signal to generate a first set of control signals and a second set of control signals;
  providing, by using a resistor DAC (RDAC), first and second voltages in response to the first set of control signals; and
  interpolating the first and second voltages to provide a first analog signal in response to the second set of control signals.

16. The method according to claim 15, wherein converting a digital signal to an analog signal is performed with monotonicity.

17. The method according to claim 15, wherein using the RDAC to provide the first and second voltages comprises, in response to the first set of control signals, selectively coupling resistors in a resistor network to nodes having the first and second voltages.

18. The method according to claim 17, wherein decoding the digital signal further comprises decoding more-significant bits (MSB) of the digital signal to generate the first set of control signals.

19. The method according to claim 15, wherein interpolating the first and second voltages comprises, in response to the second set of control signals, selectively providing the first and second voltages to a plurality of interpolator stages.

20. The method according to claim 19, wherein decoding the digital signal further comprises decoding less-significant bits (LSB) of the digital signal to generate the second set of control signals.

* * * * *